(12) United States Patent
Yoshida

(10) Patent No.: US 11,552,165 B2
(45) Date of Patent: Jan. 10, 2023

(54) SEMICONDUCTOR DEVICE AND MANUFACTURING METHOD OF THE SAME

(71) Applicant: FUJI ELECTRIC CO., LTD., Kanagawa (JP)

(72) Inventor: Soichi Yoshida, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 17/320,115

(22) Filed: May 13, 2021

(65) Prior Publication Data

US 2021/0273043 A1 Sep. 2, 2021

Related U.S. Application Data

(60) Division of application No. 16/200,424, filed on Nov. 26, 2018, now Pat. No. 11,043,555, which is a (Continued)

(30) Foreign Application Priority Data

Dec. 16, 2016 (JP) .............................. JP2016-244936

(51) Int. Cl.
*H01L 29/06* (2006.01)
*H01L 29/66* (2006.01)
(Continued)

(52) U.S. Cl.
CPC .......... *H01L 29/063* (2013.01); *H01L 21/221* (2013.01); *H01L 21/322* (2013.01);
(Continued)

(58) Field of Classification Search
CPC ... H01L 29/063; H01L 21/221; H01L 21/322; H01L 21/8234; H01L 27/06;
(Continued)

(56) References Cited

U.S. PATENT DOCUMENTS

| 10,388,773 B2 | 8/2019 | Sumitomo |
| 2012/0007141 A1 | 1/2012 | Soeno |

(Continued)

FOREIGN PATENT DOCUMENTS

| CN | 105702746 A | 6/2016 |
| CN | 105830217 A | 8/2016 |

(Continued)

OTHER PUBLICATIONS

International Search Report for International Patent Application No. PCT/JP2017/045173, issued by the Japan Patent Office dated Feb. 27, 2018.

(Continued)

*Primary Examiner* — Mohammed R Alam

(57) ABSTRACT

A semiconductor device includes a semiconductor substrate, a transistor section, a diode section, and a boundary section provided between the transistor section and the diode section in the semiconductor substrate. The transistor section has gate trench portions which are provided from an upper surface of the semiconductor substrate to a position deeper than that of an emitter region, and to each of which a gate potential is applied. An upper-surface-side lifetime reduction region is provided on the upper surface side of the semiconductor substrate in the diode section and a partial region of the boundary section, and is not provided in a region that is overlapped with the gate trench portion in the transistor section in a surface parallel to the upper surface of the semiconductor substrate.

8 Claims, 22 Drawing Sheets

Related U.S. Application Data continuation of application No. PCT/JP2017/045173, filed on Dec. 15, 2017.

(51) Int. Cl.

| | |
|---|---|
| H01L 29/10 | (2006.01) |
| H01L 21/22 | (2006.01) |
| H01L 29/739 | (2006.01) |
| H01L 27/07 | (2006.01) |
| H01L 29/78 | (2006.01) |
| H01L 27/088 | (2006.01) |
| H01L 21/8234 | (2006.01) |
| H01L 29/868 | (2006.01) |
| H01L 27/06 | (2006.01) |
| H01L 29/861 | (2006.01) |
| H01L 21/322 | (2006.01) |

(52) U.S. Cl.
CPC .......... *H01L 21/8234* (2013.01); *H01L 27/06* (2013.01); *H01L 27/0727* (2013.01); *H01L 27/0761* (2013.01); *H01L 27/088* (2013.01); *H01L 29/06* (2013.01); *H01L 29/0696* (2013.01); *H01L 29/1095* (2013.01); *H01L 29/66348* (2013.01); *H01L 29/739* (2013.01); *H01L 29/7397* (2013.01); *H01L 29/78* (2013.01); *H01L 29/861* (2013.01); *H01L 29/868* (2013.01)

(58) Field of Classification Search
CPC ............. H01L 27/0727; H01L 27/0761; H01L 27/088; H01L 29/06; H01L 29/0696; H01L 29/1095; H01L 29/66348; H01L 29/739; H01L 29/7397; H01L 29/78; H01L 29/861; H01L 29/868; H01L 2224/0603

See application file for complete search history.

(56) References Cited

U.S. PATENT DOCUMENTS

| | | | |
|---|---|---|---|
| 2012/0309208 A1* | 12/2012 | Tanida | H01L 29/8611 257/E21.328 |
| 2013/0087829 A1 | 4/2013 | Tanabe | |
| 2015/0206758 A1* | 7/2015 | Kato | H01L 29/7397 438/459 |
| 2016/0315140 A1 | 10/2016 | Iwasaki | |
| 2016/0329323 A1 | 11/2016 | Iwasaki | |
| 2017/0077216 A1 | 3/2017 | Kouno | |
| 2017/0162562 A1 | 6/2017 | Haruguchi | |
| 2017/0263603 A1 | 9/2017 | Hata | |

FOREIGN PATENT DOCUMENTS

| | | | |
|---|---|---|---|
| JP | 2008192737 A | | 8/2008 |
| JP | 2008300529 A | | 12/2008 |
| JP | 2009111188 A | | 5/2009 |
| JP | 2010147381 A | | 7/2010 |
| JP | 2012033897 A | | 2/2012 |
| JP | 2015118991 A | | 6/2015 |
| JP | 2015138801 A | | 7/2015 |
| JP | 2015185742 A | | 10/2015 |
| JP | 2016029710 A | | 3/2016 |
| JP | 2016072359 A | | 5/2016 |
| WO | 2015093086 A1 | | 6/2015 |
| WO | 2016098199 A1 | | 6/2016 |

OTHER PUBLICATIONS

Office Action issued for counterpart Japanese Application No. 2018-556762, issued by the Japan Patent Office dated Feb. 12, 2020 (drafted on Feb. 4, 2020).

Office Action issued for counterpart Japanese Application No. 2020-071516, issued by the Japan Patent Office dated Feb. 16, 2021 (drafted on Feb. 9, 2021).

Office Action issued for counterpart Chinese Application 201780033306. 9, issued by the China National Intellectual Property Administration dated Apr. 8, 2021.

U.S. Appl. No. 16/200,424, filed Nov. 26, 2018, to Soichi YOSHIDA et al.

* cited by examiner

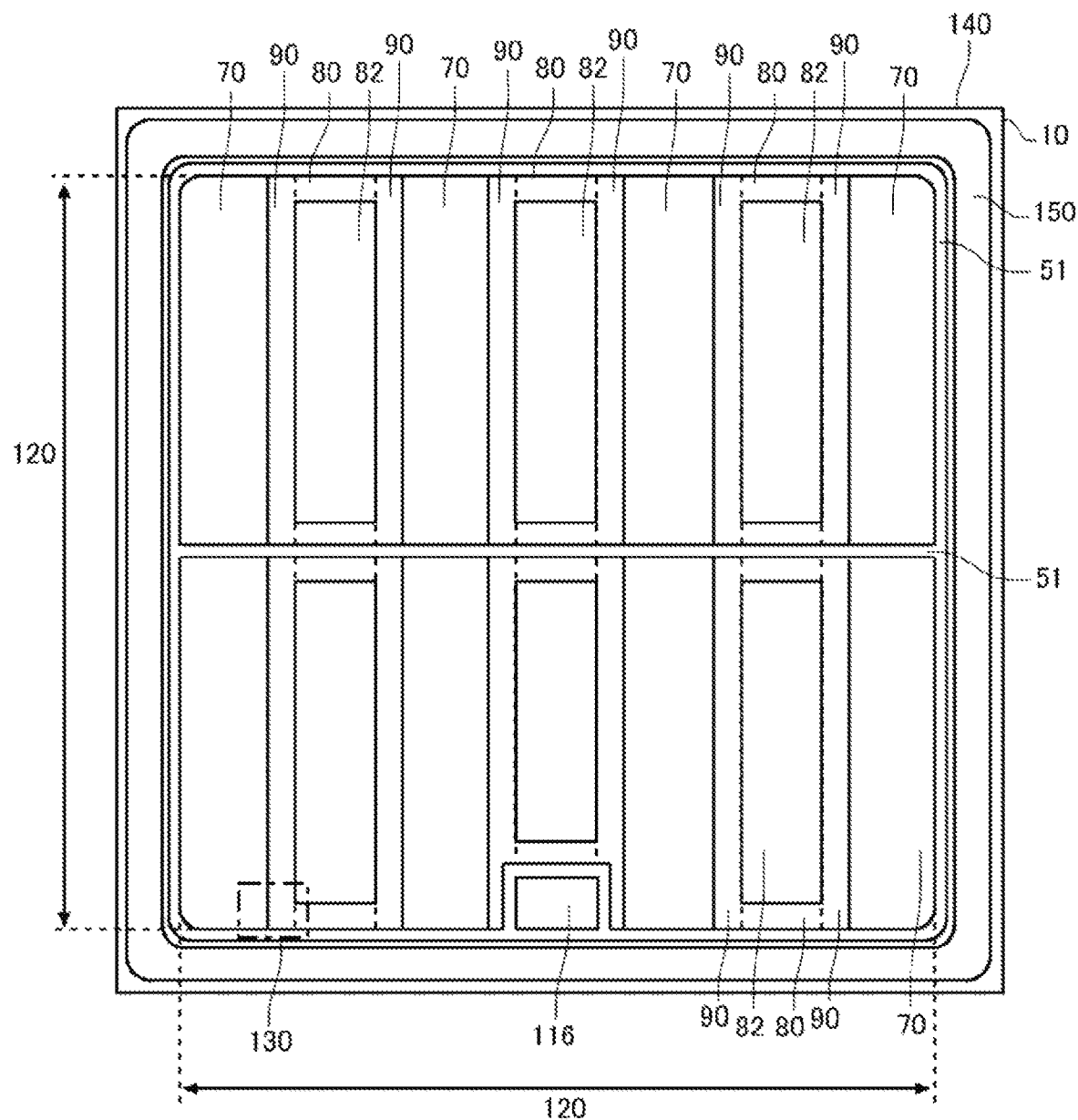
FIG. 1

SEMICONDUCTOR DEVICE AND MANUFACTURING METHOD OF THE SAME

CROSS-REFERENCE TO RELATED APPLICATIONS

This application is a divisional application of U.S. patent application Ser. No. 16/200,424, filed on Nov. 26, 2018, which is a continuation of International Application No. PCT/JP2017/045173, filed on Dec. 15, 2017, which claims priority to Japanese Patent Application No. 2016-244936, filed on Dec. 16, 2016, the contents of which are hereby incorporated herein by reference in their entirety.

BACKGROUND

1. Technical Field

The present invention relates to a semiconductor device and a manufacturing method of the same.

2. Related Art

A technique has been known that in a semiconductor device having a transistor section such as an insulated gate type bipolar transistor (IGBT) and a diode section that are formed in the same substrate, ions such as helium are irradiated to a predetermined depth position of the semiconductor substrate to control a carrier lifetime (see Patent document 1, for example).
Patent document 1: Japanese Patent Application Publication No. 2015-185742

In the semiconductor device, a smaller loss during reverse recovery is preferable. Also, variations in threshold voltage of the transistor section are preferably suppressed.

SUMMARY

In a first aspect of the present invention, there is provided a semiconductor device comprising a semiconductor substrate, a transistor section, a diode section and a boundary section. The transistor section may be provided in the semiconductor substrate to have an emitter region of a first conductivity type on the upper surface side of the semiconductor substrate, and to have a collector region of a second conductivity type on the lower surface side of the semiconductor substrate. The transistor section may have one or more gate trench portions which are provided from the upper surface of the semiconductor substrate to a position deeper than the emitter region, and to each of which a gate potential is applied. The diode section may be provided in the semiconductor substrate to have a cathode region of the first conductivity type on the lower surface side of the semiconductor substrate. The boundary section may be provided between the transistor section and the diode section in the semiconductor substrate to have a collector region in a back surface side in the semiconductor substrate, not having an emitter region on the upper surface side of the semiconductor substrate. An upper-surface-side lifetime killer is provided on the upper surface side of the semiconductor substrate in the diode section and a partial region of the boundary section, while the upper-surface-side lifetime killer may not be provided in a region that is overlapped with the gate trench portion in the transistor section in a surface parallel to the upper surface of the semiconductor substrate.

The upper-surface-side lifetime killer may not be provided in a region that is overlapped with the transistor section in a surface parallel to the upper surface of the semiconductor substrate. The transistor section and the diode section may be arranged alternately on the upper surface of the semiconductor substrate along a predetermined array direction. The end portion of the upper-surface-side lifetime killer in the array direction may be arranged nearer to a diode section side than the gate trench portion that is arranged nearest to the diode section side in the transistor section, and may be arranged nearer to the transistor section side than the cathode region.

Each of the diode section and the boundary section may have one or more dummy trench portions, provided from the upper surface of the semiconductor substrate to the inside of the semiconductor substrate, to be applied by a potential different from that of the gate potential.

The semiconductor substrate may have a plurality of the mesa portions sandwiched between the two trench portions, and the boundary section may have the upper-surface-side lifetime killer in at least one mesa portion and may not have the upper-surface-side lifetime killer in at least one mesa portion.

The upper-surface-side lifetime killer may be provided to cover a region wider than the cathode region of the diode section in a surface parallel to the upper surface of the semiconductor substrate.

The diode section may have a base region of the second conductivity type that is provided to be exposed to the upper surface of the semiconductor substrate in the region sandwiched between the dummy trench portions. The upper-surface-side lifetime killer may be provided to cover a region wider than the base region of the diode section in a surface parallel to the upper surface of the semiconductor substrate.

The semiconductor device may further comprise a well region of the second conductivity type provided inside the semiconductor substrate in an outer side than the base region in the longitudinal direction of the dummy trench portion. The region provided with the upper-surface-side lifetime killer may have a portion to be overlapped with the well region in a surface parallel to the upper surface of the semiconductor substrate.

The semiconductor device may further comprise a gate runner portion provided on the upper surface of the semiconductor substrate in an outer side than the base region in the longitudinal direction of the dummy trench portion, and formed of a semiconductor material added with an impurity. The region provided with the upper-surface-side lifetime killer may not be overlapped with the gate runner portion in a surface parallel to the upper surface of the semiconductor substrate.

The upper-surface-side lifetime killer may be also provided in a region between the gate runner portion and the outer peripheral edge of the semiconductor substrate in a surface parallel to the upper surface of the semiconductor substrate.

The semiconductor device may comprise an emitter electrode provided over the upper surface of the semiconductor substrate. The semiconductor device may comprise a protective film of which at least a part is provided over the emitter electrode. The cathode region may not be overlapped with the protective film in a surface parallel to the upper surface of the semiconductor substrate.

In a surface parallel to the upper surface of the semiconductor substrate, the upper-surface-side lifetime killer may be overlapped with the whole cathode region, and may not be overlapped with the protective film.

In a second aspect of the present invention, a semiconductor device comprising a semiconductor substrate is provided. The diode section and the transistor section are provided in the semiconductor device. The transistor section may have the semiconductor substrate, and an emitter region of the first conductivity type provided in the semiconductor substrate and located on the upper surface side of the semiconductor substrate. The transistor section may have a collector region of the second conductivity type on the lower surface side of the semiconductor substrate. The diode section may have a cathode region of the first conductivity type provided in the semiconductor substrate, and located on the lower surface side of the semiconductor substrate. The semiconductor device may comprise an emitter electrode provided over the upper surface of the semiconductor substrate. The semiconductor device may comprise a protective film of which at least a part is provided over the emitter electrode. The cathode region may not be overlapped with the protective film in a surface parallel to the upper surface of the semiconductor substrate.

In the diode section, the upper-surface-side lifetime killer may be provided on the upper surface side of the semiconductor substrate. In a surface parallel to the upper surface of the semiconductor substrate, the upper-surface-side lifetime killer may be overlapped with the whole cathode region, and may not be overlapped with the protective film.

In a surface parallel to the upper surface of the semiconductor substrate, a distance between the protective film and the upper-surface-side lifetime killer may be equal to or longer than 10 μm.

In a surface parallel to the upper surface of the semiconductor substrate, the semiconductor device may comprise a gate runner portion arranged between element regions each including at least one of the transistor section and the diode section. The protective film may be also provided over the gate runner portion. In a surface parallel to the upper surface of the semiconductor substrate, the upper-surface-side lifetime killer may not be overlapped with the protective film over the gate runner portion.

In a third aspect of the present invention, there is provided a manufacturing method that manufactures the semiconductor device in the first aspect, the manufacturing method forming an upper-surface-side lifetime reduction region by introducing the lifetime killer from the upper surface side of the semiconductor substrate thereinto.

After the emitter electrode is formed over the upper surface of the semiconductor substrate, the lifetime killer may be introduced from the upper surface side of the semiconductor substrate. After the lifetime killer is introduced, a plating layer may be formed on the upper surface of the emitter electrode.

The above summary of the invention clause does not necessarily describe all necessary features of the embodiments of the present invention. The present invention may also be a sub-combination of the features described above.

BRIEF DESCRIPTION OF THE DRAWINGS

FIG. 1 is a drawing showing a structure of an upper surface in a semiconductor device 100 according to one embodiment of the present invention.

DESCRIPTION OF EXEMPLARY EMBODIMENTS

Figure 2:
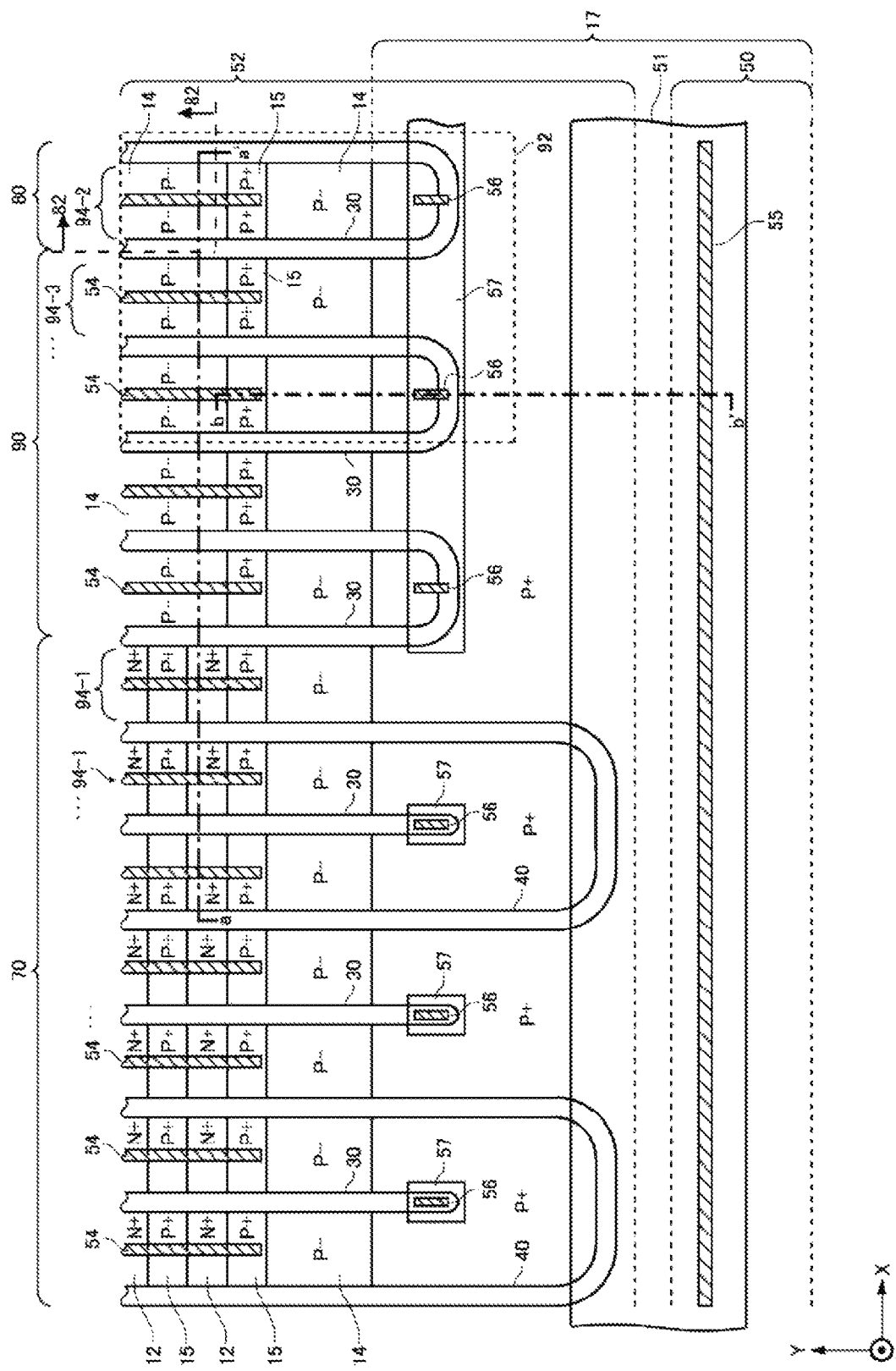
FIG. 2 is a top view showing one example of a region 130 in the semiconductor device 100 shown in FIG. 1.

Hereinafter, embodiments of the present invention will be described. The following embodiments do not limit the invention according to the claims, and all the combinations of the features described in the embodiments are not necessarily essential to means provided by aspects of the invention.

In this specification, one side in a direction parallel to the depth direction of a semiconductor substrate is referred to as an "upper" side, and the other side is referred to as a "lower" side. One of two principal surfaces of a substrate, a layer or another member is referred to as an upper surface, and the other surface is referred to as a lower surface. The "upper" and "lower" directions are not limited to the gravitational direction.

In each embodiment, there is shown an example where a first conductivity type is of n type (which may be denoted as 'N type') and a second conductivity type is of p type (which may be denoted as 'P type'); however, the first conductivity type may be of p type, and the second conductivity type may be of n type. In this case, the conductivity types of a substrate, a layer, a region and the like in each embodiment will each be oppositely polarized.

In this specification, technical matters may be described using orthogonal coordinate axes of an X-axis, Y-axis and Z-axis. In this specification, an X-Y plane is defined as a plane parallel to the upper surface of a semiconductor substrate, and the Z-axis is defined to be along a depth direction perpendicular to the upper surface of the semiconductor substrate.

In this specification, a doping concentration refers to a concentration of impurities transformed to donors or acceptors. In this specification, in some times, a difference of concentration between donors and acceptors is defined as a doping concentration. Also, when a doping concentration distribution in a doped region has a peak, a peak value thereof may be defined as the doping concentration in the doping region. For instance, in a case where the doping concentration in the doped region is almost uniform, an average value of the doping concentration in the doping region may be defined as the doping concentration.

FIG. 1 is a view showing a structure of the upper surface in a semiconductor device 100 according to one embodiment of the present invention. The semiconductor device 100 comprises a semiconductor substrate 10. The semiconductor substrate 10 may be a silicon substrate, a silicon carbide substrate, a nitride semiconductor substrate such as gallium nitride, or the like. The semiconductor substrate 10 of the present example is a silicon substrate. In this specification, the end portion of the outer perimeter of the semiconductor substrate 10 in a top view is referred to as an outer peripheral edge 140. The top view refers to a view as seen in parallel with the Z-axis from the upper surface side of the semiconductor substrate 10.

The semiconductor device 100 comprises an active portion 120, a gate runner portion 51 and an edge termination structure portion 150. The active portion 120 is a region in which a main current flows between the upper surface and the lower surface of the semiconductor substrate 10 when the semiconductor device 100 is controlled in an ON state. That is, it is a region in which a current flows in the semiconductor substrate 10 from the upper surface to the lower surface or from the lower surface to the upper surface, and flows the inside of the semiconductor substrate 10 in the depth direction.

In a surface parallel to the upper surface of the semiconductor substrate 10, at least a part of the gate runner portion 51 is provided between the active portion 120 and the outer peripheral edge 140. The gate runner portion 51 is formed of a conductive material such as polysilicon or metal, and supplies a gate voltage to an element provided in the active portion 120. The gate runner portion 51 is formed over or inside the semiconductor substrate 10, and the semiconductor substrate 10 and the gate runner portion 51 are insulated from each other by an insulating film. In a surface parallel to the upper surface of the semiconductor substrate 10, the gate runner portion 51 may be arranged to surround the active portion 120. A part of the gate runner portion 51 may be formed in the active portion 120. A part of the gate runner portion 51 may be provided across the active portion 120 in the X-axis direction.

The gate runner portion 51 is electrically connected to a gate pad 116 provided outside the active portion 120. The gate pad 116 may be arranged between the active portion 120 and the outer peripheral edge 140. A pad such as an emitter pad electrically connected to the emitter electrode may be provided between the active portion 120 and the outer peripheral edge 140.

The active portion 120 is provided with the transistor section 70 and the diode section 80. The boundary section 90 may be provided between the transistor section 70 and the diode section 80. In this specification, the transistor section 70, the diode section 80 and the boundary section 90 each may be referred to as an element section or an element region. The region provided with the element section may be defined as the active portion 120. Note that in the top view of the semiconductor substrate 10, the region sandwiched between the two element sections is defined as the active portion 120.

In the example of FIG. 1, even a region provided with the gate runner portion 51 to be sandwiched between the element sections is included in the active portion 120. The active portion 120 can also be provided as a region where the emitter electrode is provided in a top view of the semiconductor substrate 10, and a region sandwiched by regions where the emitter electrode is provided. In the example of FIG. 1, the emitter electrode is provided over the transistor section 70, the diode section 80 and the boundary section 90.

The transistor section 70 includes a transistor such as an IGBT. The diode section 80 is arranged alternately with the transistor section 70 in a predetermined first direction on the upper surface of the semiconductor substrate 10. The first direction is the X-axis direction in FIG. 1. In this specification, the first direction may be referred to as an array direction.

In each diode section 80, a cathode region 82 of N+ type is provided in a region that is in contact with the lower surface of the semiconductor substrate 10. The diode section 80 is a region in which a cathode region 82 is provided on the lower surface of the semiconductor substrate 10. In the semiconductor device 100 of the present example, the regions other than the cathode region 82 among the regions that are in contact with the lower surface of the semiconductor substrate are collector regions of P+ type.

The diode section 80 is a region where the cathode region 82 is projected in the Z-axis direction. Note that as shown by a broken line in FIG. 1, a region such that a region where the cathode region 82 is projected in the Z-axis direction is extended to an end portion of the active portion 120 (for example, a position in contact with the gate runner portion 51) in the Y-axis direction is also regarded as the diode section 80.

The transistor section 70 is a region where the collector region is formed on the lower surface of the semiconductor substrate 10 and a unit structure including an emitter region of N+ type is periodically formed on the upper surface of the semiconductor substrate 10. Among the regions in which the collector region is formed on the lower surface of the semiconductor substrate 10, the boundary section 90 is a region other than the transistor section 70.

The transistor section 70 may be provided at both ends of the active portion 120 in the X-axis direction. The active portion 120 may be divided in the Y-axis direction by the gate runner portion 51. The transistor section 70 and the diode section 80 are arranged alternately in the X-axis direction in each divided region of the active portion 120.

The edge termination structure portion 150 is provided between the active portion 120 and the outer peripheral edge 140 of the semiconductor substrate 10 on the upper surface of the semiconductor substrate 10. The edge termination structure portion 150 of the present example is provided between the gate runner portion 51 and the outer peripheral edge 140. The edge termination structure portion 150 may be arranged in a circular pattern to surround the active portion 120 on the upper surface of the semiconductor substrate 10. The edge termination structure portion 150 of the present example is arranged along the outer peripheral edge 140 of the semiconductor substrate 10. The edge termination structure portion 150 relaxes an electric field concentration at an upper surface side of the semiconductor substrate 10. The edge termination structure portion 150 has a structure of a guard ring, a field plate, a RESURF, and a combination thereof, for example.

FIG. 2 is a top view showing one example of the region 130 in the semiconductor device 100 shown in FIG. 1. The semiconductor device 100 of the present example is a semiconductor chip that has a transistor section 70 which includes a transistor such as an IGBT and a diode section 80 which includes a diode such as an FWD (Free Wheel Diode) to be provided in the semiconductor substrate.

The boundary section 90 is provided between the transistor section 70 and the diode section 80 on the upper surface of the semiconductor substrate. The upper surface of the semiconductor substrate refers to one of the two principal surfaces opposite to each other in the semiconductor substrate. In FIG. 2, an upper surface of a chip around an end portion of the chip is shown, and other regions are omitted.

Also, though FIG. 2 shows an active region of the semiconductor substrate in the semiconductor device 100, the semiconductor device 100 as shown in FIG. 1 may have the edge termination structure portion 150 to surround the active region.

The semiconductor device 100 of the present example comprises a gate trench portion 40 formed inside the upper surface side of the semiconductor substrate, a dummy trench portion 30, a well region 17, an emitter region 12, a base region 14 and a contact region 15. Also, the semiconductor device 100 of the present example also includes an emitter electrode 52 and a gate metal layer 50 provided over the upper surface of the semiconductor substrate. The emitter electrode 52 and the gate metal layer 50 are provided to be separated from each other.

An interlayer dielectric film is formed between the emitter electrode 52 and the gate metal layer 50, and the upper surface of the semiconductor substrate, but it is omitted in FIG. 2. In the interlayer dielectric film of the present example, a contact hole 54, a contact hole 55 and a contact hole 56 are formed to penetrate the interlayer dielectric film.

The emitter electrode 52 is electrically connected to the emitter region 12, the contact region 15 and the base region 14 on the upper surface of the semiconductor substrate via the contact hole 54. Also, the emitter electrode 52 is connected with dummy conductive portions in the dummy trench portions 30 via the contact hole 56. Connecting portions 57 formed of a conductive material such as polysilicon doped with impurities may be provided between the emitter electrode 52 and the dummy conductive portions. The connecting portions 57 are formed on the upper surface of the semiconductor substrate.

The gate metal layer 50 is in contact with the gate runner portion 51 via the contact hole 55. The gate runner portion 51 is formed of a semiconductor such as polysilicon doped with impurities. The gate runner portion 51 is connected to a gate conductive portion in the gate trench portion 40 on the upper surface of the semiconductor substrate. That is, the gate runner portion 51 is formed over between a portion of the gate trench portion 40 and the contact hole 55 on the upper surface of the semiconductor substrate.

The emitter electrode 52 and the gate metal layer 50 are formed of a metal-containing material. For example, at least a partial region of each electrode is formed of aluminum or an aluminum-silicon alloy. Each electrode may have a barrier metal formed of titanium, a titanium compound or the like in a lower layer of a region formed of aluminum or the like, and may also have a plug formed of tungsten or the like in the contact hole.

In the transistor section 70, one or more gate trench portions 40 are arrayed at a predetermined interval along a short direction of each trench. The gate conductive portion inside the gate trench portion 40 is electrically connected to the gate metal layer 50 to be applied by a gate potential. In the transistor section 70, one or more dummy trench portions 30 may be arrayed at a predetermined interval along the short direction. A potential different from the gate potential is applied to the dummy conductive portion inside the dummy trench portion 30. The dummy conductive portion of the present example is electrically connected to the emitter electrode 52 to be applied by an emitter potential.

In the transistor section 70, one or more gate trench portions 40 and one or more dummy trench portions 30 may be formed alternately along the short direction. Also, the dummy trench portions 30 are arrayed in the diode section 80 and the boundary section 90 at a predetermined interval along the short direction.

The gate trench portion 40 and the dummy trench portion 30 are formed by extending in a predetermined longitudinal direction on the upper surface of the semiconductor substrate. A portion of the dummy trench portion 30 in the transistor section 70 of the present example has a straight shape, and is formed to extend in a longitudinal direction perpendicular to the short direction mentioned above. The dummy trench portion 30 may have a U shape that connects tip portions of two straight portions to each other. In an example of FIG. 2, the dummy trench portion 30 of the transistor section 70 has a straight shape, and the diode section 80 and the dummy trench portion 30 in the boundary section 90 has a U shape; however, the shape of the dummy trench portion 30 is not limited to the example of FIG. 2. At least a part of the dummy trench portion 30 in the transistor section 70 may have a U shape, and at least a part of the dummy trench portion 30 in the diode section 80 and the boundary section 90 may have a straight shape.

In FIG. 2, the X-axis direction is defined as a short direction of the trench portion. Also, the Y-axis direction is defined as a longitudinal direction of the trench portion. The X-axis and the Y-axis are axes orthogonal to each other in a surface parallel to the upper surface of the semiconductor substrate. Also, the axis orthogonal to the X-axis and the Y-axis is defined as the Z-axis. In this specification, the Z-axis direction may be referred to as a depth direction.

The gate trench portion 40 in the example of FIG. 2 has a straight portion and a connecting portion that connects two straight portions. The straight portion is formed to extend in the above-mentioned longitudinal direction. The straight portions of the individual trench portions are formed in parallel to each other. The connecting portion may have a curve shape on the upper surface of the semiconductor substrate.

In the connecting portion at the tip portion of the gate trench portion 40, the gate conductive portion inside the gate trench portion 40 is connected to the gate runner portion 51. The gate trench portion 40 may be provided protrusively from the dummy trench portion 30 toward the gate runner portion 51 side in the longitudinal direction (Y-axis direction). The protruding portion of the gate trench portion 40 is connected to the gate runner portion 51.

The emitter electrode 52 is formed over the gate trench portion 40, the dummy trench portion 30, the well region 17, the emitter region 12, the base region 14 and the contact region 15. The well region 17 is formed within a predetermined range from an end portion of the active region on a side provided with the gate metal layer 50. In the present example, the end portion of the well region 17 in the Y-axis direction is connected to the end portion of the base region 14. A diffusion depth of the well region 17 may be deeper than a depth of the gate trench portion 40 and the dummy trench portion 30. Some regions of the gate trench portion 40 and the dummy trench portion 30 on the gate metal layer 50 side are formed in the well region 17. A bottom of an end of the dummy trench portion 30 in the longitudinal direction may be covered with the well region 17.

The semiconductor substrate has the first conductivity type, and the well region 17 has the second conductivity type different from that of the semiconductor substrate. The semiconductor substrate of the present example is of N– type, and the well region 17 is of P+ type. The base region 14 is formed in the mesa portion that is a region sandwiched by individual trench portions. The base region 14 is of the second conductivity type having a lower doping concentration than that of the well region 17. The base region 14 of the present example is of P– type. Note that signs of '+' and '–' in the conductivity type represent a relatively higher doping concentration in a '+' case and a relatively lower doping concentration in a '–' case.

A contact region 15 of the second conductivity type having a higher doping concentration than that of the base region 14 may be selectively formed on the upper surface of the base region 14 in each mesa portion. The contact region 15 of the present example is of P+ type. Also, in the transistor section 70, the emitter region 12 of the first conductivity type having a higher doping concentration than that of the semiconductor substrate is selectively formed on an upper surface of the base region 14. The emitter region 12 of the present example is of N+ type. In the present example, the emitter region 12 is not formed in the mesa portions of the diode section 80 and the boundary section 90.

Each of the contact region 15 and the emitter region 12 is formed to extend from one of the directly contacting trench portions to the other. One or more contact regions 15 and one or more emitter regions 12 of the transistor section 70 are formed to be exposed to an upper surface of the mesa portion alternately along the longitudinal direction of the trench portion.

Also, in the mesa portion of the diode section 80 and the boundary section 90, the contact region 15 is formed in a region opposed to at least one contact region 15 in the transistor section 70. In the example of FIG. 2, in the mesa portions of the diode section 80 and the boundary section 90, the contact region 15 is formed in a region opposed to the contact region 15 nearest to the gate metal layer 50 side in the transistor section 70, and the base region 14 is formed in another region.

In the transistor section 70, the contact hole 54 is formed over each region of the contact region 15 and the emitter region 12. The contact hole 54 is not formed in a region corresponding to the base region 14 and the well region 17. In a surface layer of the contact region 15 that is in contact with the emitter electrode 52 in the contact hole 54, there may exist a second contact region 62 (see FIG. 8) having a higher concentration to be shallower as compared to the contact region 15. The second contact region 62 is of P+ type.

In the diode section 80 and the boundary section 90, the contact hole 54 is formed over the contact region 15 and the base region 14. In the present example, the contact holes 54 of the transistor section 70, the diode section 80 and the boundary section 90 have the same length in the longitudinal direction of each trench portion. In the surface layer of the contact region 15 that is in contact with the emitter electrode 52 in the contact hole 54 or of the base region 14, there may exist the second contact region 62 that is formed at a higher concentration to a shallower position as compared to the contact region 15.

In the present example, the transistor section 70 refers to a region in which the emitter region of the first conductivity type is provided in the mesa portion on the upper surface side of the semiconductor substrate and the collector region of the second conductivity type is provided on the lower surface side of the semiconductor substrate. Also, the boundary section 90 refers to a region in which the emitter region of the first conductivity type is not provided in the mesa portion on the upper surface side of the semiconductor substrate and the collector region is provided on the lower surface side of the semiconductor substrate. Also, the diode section 80 refers to a region in which the emitter region of the first conductivity type is not provided in the mesa portion on the upper surface side of the semiconductor substrate and the cathode region of the first conductivity type is provided in the lower surface side of the semiconductor substrate. Note that in FIG. 2, the cathode region 82 provided on the lower surface side of the semiconductor substrate is shown by a position when projected to the upper surface side.

The diode section 80 and a partial region of the boundary section 90 are provided with an upper-surface-side lifetime reduction region 92 on the upper surface side of the semiconductor substrate. In the boundary section 90, a region provided with the upper-surface-side lifetime reduction region 92 is in direct contact with the diode section 80. On the other hand, the upper-surface-side lifetime reduction region 92 is not provided in the transistor section 70. The upper-surface-side lifetime reduction region 92 is selectively formed at a predetermined depth position between the middle of the semiconductor substrate in the depth direction and the upper surface of the semiconductor substrate. The upper-surface-side lifetime reduction region 92 is a region in which the lifetime killer is intentionally introduced by, for example, implantation of impurities into the semiconductor substrate 10. A value of the lifetime in carriers of electrons or holes in the region intentionally introduced with the lifetime killer is smaller than that of the carriers in the region not intentionally introduced with the lifetime killer. The lifetime killer is a recombination center of the carriers, and may be a crystal defect, and may be a vacancy, a divacancy, a dangling bond formed by the vacancy or the like, a defect complex with elements constituting the semiconductor substrate 10 with these, a dislocation, a rare gas element such as helium or neon, and a metal element such as platinum. As one example, the upper-surface-side lifetime reduction region 92 is formed by irradiating ions such as helium to the depth position.

When the upper-surface-side lifetime reduction region 92 is provided in the diode section 80, the carrier lifetime in the diode section 80 is adjusted, so that a loss during reverse recovery can be reduced. Also, since the boundary section 90 is provided, and the upper-surface-side lifetime reduction region 92 is provided even in the boundary section 90, the lifetime of holes flown in the diode section 80 from the transistor section 70 can be controlled even when the upper-surface-side lifetime reduction region 92 is not provided in the transistor section 70. Since the upper-surface-side lifetime reduction region 92 is not provided in the transistor section 70, a gate insulating film and the like in the transistor section 70 are not damaged even when ions such as helium are irradiated from the upper surface side of the semiconductor substrate. For this reason, variations in a threshold voltage and so on in the transistor section 70 can be suppressed. Also, since ions such as helium can be irradiated from the upper surface side of the semiconductor substrate, an irradiation position of the ions can be set shallower, so that a depth position of the upper-surface-side lifetime reduction region 92 can be controlled with high precision.

Also, as compared to a case where the ions such as helium is irradiated from the back surface side of the semiconductor substrate, an acceleration energy that irradiates the ions such as helium can be made smaller, so that the cost such as a mask can be reduced. The acceleration energy that irradiates the ions such as helium may be a value such that the semiconductor substrate is not transmitted (not penetrated) by to-be-irradiated ions.

Conventionally, in a situation where an energy absorbent is placed between an accelerator that accelerates ions and a semiconductor substrate, an irradiation has been made at a high acceleration energy (10 MeV or more) such that to-be-irradiated ions may penetrate the semiconductor substrate. In this case, a position (depth) of the ions to be stopped in the semiconductor substrate is adjusted such that an energy of the ions is absorbed by, for instance, a thickness of the energy absorbent. In the ion irradiation by such a high acceleration energy, damage to be given to the semiconductor substrate is not only too large, but also a full width at half maximum of the ions is on the order of 10 μm, so that a distribution width of lattice defects to a thickness of the semiconductor substrate is also increased. On the other hand, even if the energy absorbent is not used, when irradiation is made by the ions such as helium at an acceleration energy such that the ions are stopped inside the semiconductor substrate, a desired low lifetime region can be formed in a narrower region without excessive damage to be given thereto.

The acceleration energy that irradiates helium ions to the semiconductor substrate without using the energy absorbent may be set as follows. When the semiconductor substrate is silicon, with respect to a range Rp of helium ions in the semiconductor substrate (position in which a concentration of helium is peaked) and an acceleration energy E of helium ions, a relation of the following expression (1) may be satisfied, where a logarithm (log(Rp)) of the range Rp of helium ions is x, and a logarithm (log(E)) of the acceleration energy E of helium ions is y:

$$y = -0.0169x^4 + 0.1664x^3 - 0.6161x^2 + 1.6157x + 5.2681 \quad (1)$$

Note that the acceleration energy E of the helium ions irradiation is calculated from a desired average range Rp of helium ions (referred to as calculation value E) by use of the above fitting expression, and in a case where the helium ions are implanted into the silicon substrate at the calculation value E of the acceleration energy, a relation between an actual acceleration energy E' and an average range Rp' (peak position of helium ions) actually obtained by a secondary ion mass spectrometry (SIMS) or the like may be considered as follows. With respect to the calculation value E of the acceleration energy, when the actual acceleration energy is within a range of about E±10%, the actual average range Rp' also falls in a range of about ±10% with respect to the desired average range Rp to be within a range of a measurement error. Therefore, an effect by variations of the actual average range Rp' from the desired average range Rp on electrical characteristics of IGBTs, diodes and so on is sufficiently small to a negligible extent.

Accordingly, when the actual acceleration energy E' is within a range of the calculation value E±5%, it can be determined that the actual average range Rp' is the average range Rp as substantially set. Alternatively, for the actual acceleration energy E', with respect to the average range Rp calculated by application to the above expression (1) in order to obtain the value E', the actual average range Rp' falls within ±10% thereof, which poses no problem. In the actual accelerator, since both the acceleration energy E and the average range Rp can fall in the above range (±10%), the following consideration is completely no problem: the actual acceleration energy E' and the actual average range Rp' conform with the foregoing fitting expression that is represented by the desired average range Rp and the calculation value E.

Further, it is acceptable that the range of the variation or error is within ±10% as described above with respect to the average range Rp; preferably, when that range may fall within ±5% thereof, it can be considered to conform perfectly with the above expression (1). By use of the above expression (1), the acceleration energy E of helium ions required to obtain the desired range Rp of helium ions can be calculated.

Figure 3:
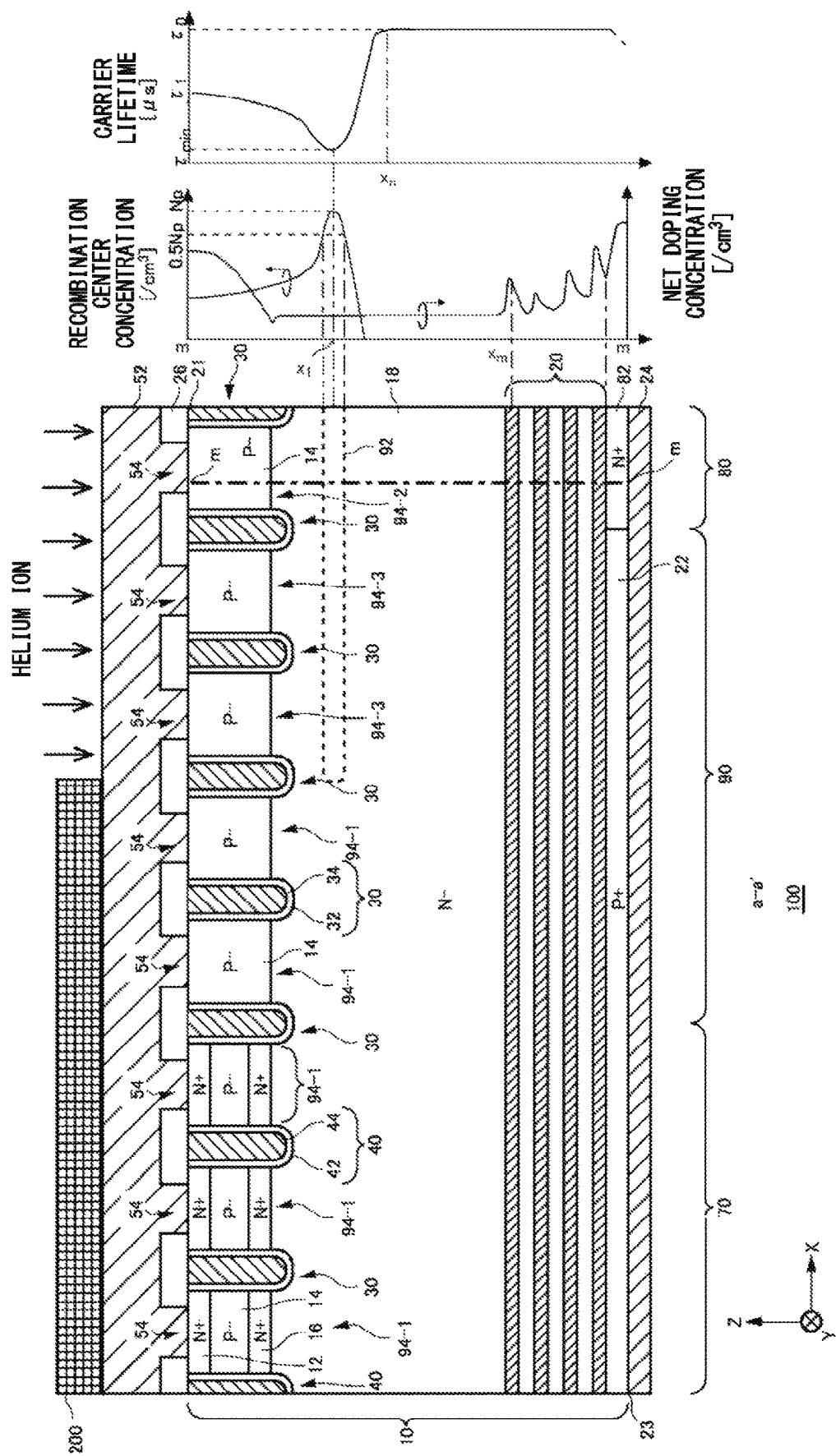
FIG. 3 is a drawing showing one example in a cross-section a-a' of the semiconductor device 100 shown in FIG. 2.

FIG. 3 is a drawing showing one example in a cross-section a-a' of the semiconductor device 100 shown in FIG. 2. The cross-section a-a' is a cross-section that is parallel to an X-Z plane, and passes through the emitter region 12 of the transistor section 70. In FIG. 3, a mask 200 used in a manufacture of the semiconductor device 100 is shown together.

The semiconductor device 100 of the present example has, in the cross-section, a semiconductor substrate 10, an interlayer dielectric film 26, an emitter electrode 52 and a collector electrode 24. The emitter electrode 52 is formed on the semiconductor substrate 10 and an upper surface of the interlayer dielectric film 26.

The collector electrode 24 is formed on a lower surface 23 of the semiconductor substrate 10. The lower surface refers to the surface on the opposite side of the upper surface. The emitter electrode 52 and the collector electrode 24 are formed of a conductive material such as metal. Also, in this specification, a surface or end portion of each member such as a substrate, layer or region on the emitter electrode 52 side is referred to as an upper surface or upper end, and a surface or end portion thereof on the collector electrode 24 side is referred to as a lower surface or lower end. Also, a direction that connects the emitter electrode 52 to the collector electrode 24 is defined as the Z-axis direction (depth direction).

The semiconductor substrate 10 may be a silicon substrate, may be a silicon carbide substrate, or may be a nitride semiconductor substrate such as gallium nitride or the like. The base region 14 of P– type is formed on an upper surface 21 side of the semiconductor substrate 10.

In the cross-section, the emitter region 12 of N+ type and the base region 14 of P– type are formed on an upper surface side of each mesa portion 94 in the transistor section 70 in order from the upper surface 21 side of the semiconductor substrate 10. The accumulation region 16 of N+ type may be formed under the base region 14.

In the cross-section, the base region 14 of P− type is formed on an upper surface side of each mesa portion 94 in the diode section 80 and the boundary section 90. The emitter region 12 may not be formed in each mesa portion 94 of the diode section 80 and the boundary section 90. Also, the accumulation region 16 may not be formed in each mesa portion 94 of the diode section 80 and the boundary section 90.

In the transistor section 70, the drift region 18 of N− type is formed on a lower surface of the accumulation region 16. The accumulation region 16 having a concentration higher than that of the drift region 18 can be provided between the drift region 18 and the base region 14 to thereby increase a carrier injection-enhancement effect (IE effect) and reduce an ON voltage.

In the diode section 80 and the boundary section 90, the drift region 18 is formed on a lower surface of the base region 14. In both of the transistor section 70 and the diode section 80, a buffer region 20 of N− type is formed on a lower surface of the drift region 18.

The buffer region 20 is formed on a lower surface side of the drift region 18 The doping concentration of the buffer region 20 is higher than the doping concentration of the drift region 18. The buffer region 20 may work as a field stop layer to prevent a depletion layer expanded from a lower surface side of the base region 14, from reaching a collector region 22 of P+ type and a cathode region 82 of N+ type.

The buffer region 20 may have a plurality of peaks in a doping concentration distribution in the depth direction. In an example of FIG. 3, the doping concentration distribution in the buffer region 20 has four peaks. The peaks of the doping concentration in the buffer region 20 may be a concentration peak of hydrogen donors formed by proton injection and thermal treatment.

In the transistor section 70 and the boundary section 90, the collector region 22 of P+ type is formed on a lower surface of the buffer region 20. In the diode section 80, the cathode region 82 of N+ type is formed on a lower surface of the buffer region 20.

One or more gate trench portions 40 and one or more dummy trench portions 30 are formed on the upper surface 21 side of the semiconductor substrate 10. Each trench portion passes through the base region 14 from the upper surface 21 of the semiconductor substrate 10 and reaches the drift region 18. For regions provided with at least either of the emitter region 12, the contact region 15 and the accumulation region 16, each trench portion also passes through the regions and reaches the drift region 18.

The gate trench portion 40 has a gate trench, a gate insulating film 42 and a gate conductive portion 44 formed on the upper surface 21 side of the semiconductor substrate 10. The gate insulating film 42 is formed to cover an inner wall of the gate trench. The gate insulating film 42 may be formed by oxidizing or nitriding semiconductors on the inner wall of the gate trench. The gate conductive portion 44 is formed inside the gate trench in an inner side than the gate insulating film 42. That is, the gate insulating film 42 insulates the gate conductive portion 44 from the semiconductor substrate 10. The gate conductive portion 44 is formed of a conductive material such as polysilicon added with impurities.

The gate conductive portion 44 includes at least a region opposed to the adjacent base region 14 in the Z-axis direction. The gate trench portion 40 is covered with the interlayer dielectric film 26 on the upper surface 21 of the semiconductor substrate 10. In the present example, in the tip portion of the gate trench portion 40 shown in FIG. 2, the gate conductive portion 44 is electrically connected to the gate metal layer 50 through the gate runner portion 51. When a predetermined voltage is applied to the gate conductive portion 44, a channel is formed in an interfacing surface layer of the base regions 14 in contact with the gate trench portions 40.

The dummy trench portion 30 may have the same structure as that of the gate trench portion 40 in the cross-section. The dummy trench portion 30 has a dummy trench, a dummy insulating film 32 and a dummy conductive portion 34 formed on the upper surface 21 side of the semiconductor substrate 10. The dummy insulating film 32 is formed to cover an inner wall of the dummy trench. The dummy conductive portion 34 is formed inside the dummy trench and formed in an inner side than the dummy insulating film 32. The dummy insulating film 32 insulates the dummy conductive portion 34 from the semiconductor substrate 10. The dummy conductive portion 34 may be formed of the same material as that of the gate conductive portion 44. The dummy trench portion 30 may have the same length as that of the gate trench portion 40 in the depth direction.

The dummy trench portion 30 is covered with the interlayer dielectric film 26 on the upper surface 21 of the semiconductor substrate 10. In the present example, the dummy conductive portion 34 is electrically connected to the emitter electrode 52 through the contact hole 56 and the connecting portion 57 as shown in FIG. 2.

In the cross-section, the upper-surface-side lifetime reduction region 92 is provided in the whole diode section 80, and in a partial region in direct contact with the diode section 80 in the boundary section 90. The boundary section 90 has the upper-surface-side lifetime reduction region 92 in at least one mesa portion 94 adjacent to the diode section 80, and may not have the upper-surface-side lifetime reduction region 92 in at least one mesa portion 94 adjacent to the transistor section 70. The upper-surface-side lifetime reduction region 92 may be terminated under any trench portion, and may be terminated under any mesa portion 94.

When the boundary section 90 is provided, a distance between the cathode region 82 of N+ type and the transistor section 70 can be made longer. Then, when the upper-surface-side lifetime reduction region 92 is formed in a part of the boundary section 90, the lifetime of holes injected in the diode section 80 from the transistor section 70 can be appropriately controlled, so that a loss during reverse recovery can be reduced.

Since the upper-surface-side lifetime reduction region 92 is formed in the whole diode section 80 and a part of the boundary section 90, it can be formed over a region wider than the cathode region 82 in the X-axis direction. The upper-surface-side lifetime reduction region 92 may be formed over half or more of the region of the boundary section 90 in the X-axis direction.

Alternatively, a length in the X-axis direction of the region in which the upper-surface-side lifetime reduction region 92 is formed in the boundary section 90 may be longer than a length in the X-axis direction of the region in which the upper-surface-side lifetime reduction region 92 is not formed in the boundary section 90. For example, the upper-surface-side lifetime reduction region 92 may be formed in a region other than one mesa portion 94 adjacent to the transistor section 70 in the boundary section 90. In this way, the lifetime of holes injected from the transistor section 70 in the diode section 80 can be easily controlled.

Also, by a configuration that the upper-surface-side lifetime reduction region 92 is not formed in one mesa portion 94 adjacent to the transistor section 70, even when an irradiation position of helium ions or the like is shifted by variation in manufacturing and so on, helium ions or the like can be prevented from being irradiated to the gate trench portion 40. In this way, variations of a threshold voltage and so on in the transistor section 70 can be suppressed.

The mask 200 is used at a process of forming the upper-surface-side lifetime reduction region 92. In the present example, when helium ions are irradiated from the upper surface side of the semiconductor substrate 10 with the mask 200, the upper-surface-side lifetime reduction region 92 is formed. The mask 200 may be formed such that a resist or the like is coated to be patterned in a predetermined shape. The upper-surface-side lifetime reduction region 92 is not formed in a region covered with the mask 200.

The mask 200 formed by coating of the resist or the like may be formed to be in contact with a structure formed on the upper surface 21 of the semiconductor substrate 10. In the present example, the structure formed on the upper surface 21 of the semiconductor substrate 10 is the emitter electrode 52. A hard mask formed of a material such as metal or silicon needs to be formed apart by a predetermined distance from the emitter electrode 52 in an outer side than the upper surface 21 (in the +Z-axis direction), so as not to cause scratches, defects or the like to the structure such as the electrode, the protective film and the interlayer dielectric film formed on the upper surface 21 of the semiconductor substrate 10. Therefore, a fine alignment with a surface structure provided inside the upper surface 21 side or outside the upper surface 21 of the semiconductor substrate 10 becomes difficult. As the present example, when the mask 200 is formed to be in contact with the structure formed on the upper surface 21 of the semiconductor substrate 10, an alignment with an extremely fine surface structure is facilitated.

The upper-surface-side lifetime reduction region 92 may be formed before the emitter electrode 52. The upper-surface-side lifetime reduction region 92 of the present example is formed after each trench portion, base region 14, accumulation region 16 and emitter region 12 are formed.

In the present example, since helium ions are irradiated from the upper surface side of the semiconductor substrate 10, the depth position of the upper-surface-side lifetime reduction region 92 can be controlled with high precision as compared to a case where helium ions are irradiated from the back surface side. Also, since the transistor section 70 is covered with the mask 200, damage to the gate trench portion 40 due to the irradiation of helium ions can be prevented. Also, since helium ions are irradiated at a shallow position, a hard mask may not be used. For this reason, the cost can be reduced.

Note that in FIG. 3, there is shown, in a cross-section m-m, a concentration distribution, a net doping concentration distribution and a carrier lifetime distribution in the Z-axis direction of the recombination center on the upper-surface-side lifetime reduction region 92. The upper-surface-side lifetime reduction region 92 of the present example is formed by irradiation of helium ions from the upper surface side of the semiconductor substrate 10.

A concentration of the lifetime killer (recombination center) on the upper-surface-side lifetime reduction region 92 is a peak concentration Np at a predetermined depth position. The depth position is arranged in the drift region 18 nearer to the upper surface 21 side than the middle of the semiconductor substrate 10 in the depth direction. A region having a lifetime killer at a higher concentration than a half value 0.5 Np of the peak concentration Np may be provided as a region of the upper-surface-side lifetime reduction region 92.

When helium ions or the like are irradiated from the upper surface 21 side, the lifetime killer having a concentration lower than the peak concentration Np distributes from the peak position to the upper surface 21 of the semiconductor substrate 10 to trail a skirt. On the other hand, the concentration of the lifetime killer nearer to a lower surface 23 side of the semiconductor substrate 10 than the peak position is steeply dropped as compared to the concentration of the lifetime killer nearer to an upper surface 21 side of the semiconductor substrate 10 than the peak position. The concentration distribution of the upper-surface-side lifetime reduction region 92 may not reach the lower surface 23.

Also, assuming a distribution that trails a skirt continuously from the upper surface 21 to a position of the peak concentration Np, the depth position of the peak concentration Np may be located nearer at a lower surface 23 side than the intermediate position of the semiconductor substrate 10 in the depth direction. Note that when helium ions or the like are irradiated from the lower surface 23 side, the lifetime killer having a concentration lower than the peak concentration Np may distribute to trail a skirt more toward a lower surface 23 side than the peak position.

Note that as described above, the concentration distribution of the recombination center shown in FIG. 3 may be the helium concentration as mentioned above, and may be a crystal defect density formed by the helium irradiation. The crystal defect may be an interstitial helium, a vacancy, a divacancy and the like, and a dangling bond formed by the vacancy and the like. Due to these crystal defects, the recombination center of the carriers is formed. The recombination of the carriers is facilitated through an energy level (trap level) of the formed energy recombination center. A recombination center concentration corresponds to a trap level density.

A plurality of regions shown by hatched lines (four regions in the present example) in the buffer region 20 are regions that include a position that exhibits a peak concentration of the doping concentration distribution in the buffer region 20. Each width in the depth direction of the plurality of regions shown by the hatched lines, as one example, may correspond to a full width at half maximum of the peak doping concentration with the peak position as a center.

A peak position $x_1$ of the recombination center concentration in the upper-surface-side lifetime reduction region 92 may be away, toward the upper surface 21 side, from the peak position $x_m$ that is located nearest to the upper surface 21 side among the plurality of peak positions in the buffer region 20. When the buffer region 20 contains hydrogen donors, at a peak position that exhibits a local maximum value in a concentration of the hydrogen donors, hydrogen may terminate the vacancy, the dangling bond and the like to reduce the recombination center concentration. For this reason, the peak position of the recombination center concentration in the upper-surface-side lifetime reduction region 92 may be separated from the peak position of the buffer region 20 to reduce an effect of the termination by hydrogen. Moreover, the peak position of the recombination center concentration in the upper-surface-side lifetime reduction region 92 may be formed between the plurality of peak positions in the buffer region 20. This also provides an effect of reducing the effect of the termination by hydrogen.

The carrier lifetime distribution shown in FIG. 3 indicates a minimum value $\tau_{min}$ at a position substantially corresponding to the peak concentration position of the recombination center concentration. In the base region 14 nearest to the upper surface 21, the carrier lifetime distribution may have a value $\tau_1$ larger than the value $\tau_{min}$. In another region not introducing the lifetime killer in the depth direction, the carrier lifetime distribution may distribute at an almost constant value (denoted as $\tau_0$) in a region deeper than the peak concentration position of the recombination center concentration. In the buffer region 20, due to the termination effect of the vacancy, the dangling bond and the like by hydrogen, the carrier lifetime distribution may distribute at a value of about $\tau_0$. A position $x_n$ in which the carrier lifetime reduces from $\tau_0$ may be located nearer to the upper surface 21 side than a peak position $x_m$ that is located nearest to the upper surface 21 side, among the plurality of peak concentrations in the buffer region 20. Note that the carrier lifetime in the vicinity of the upper surface 21 and the lower surface 23 may be smaller than $\tau_0$ due to a high doping concentration.

Figure 4:
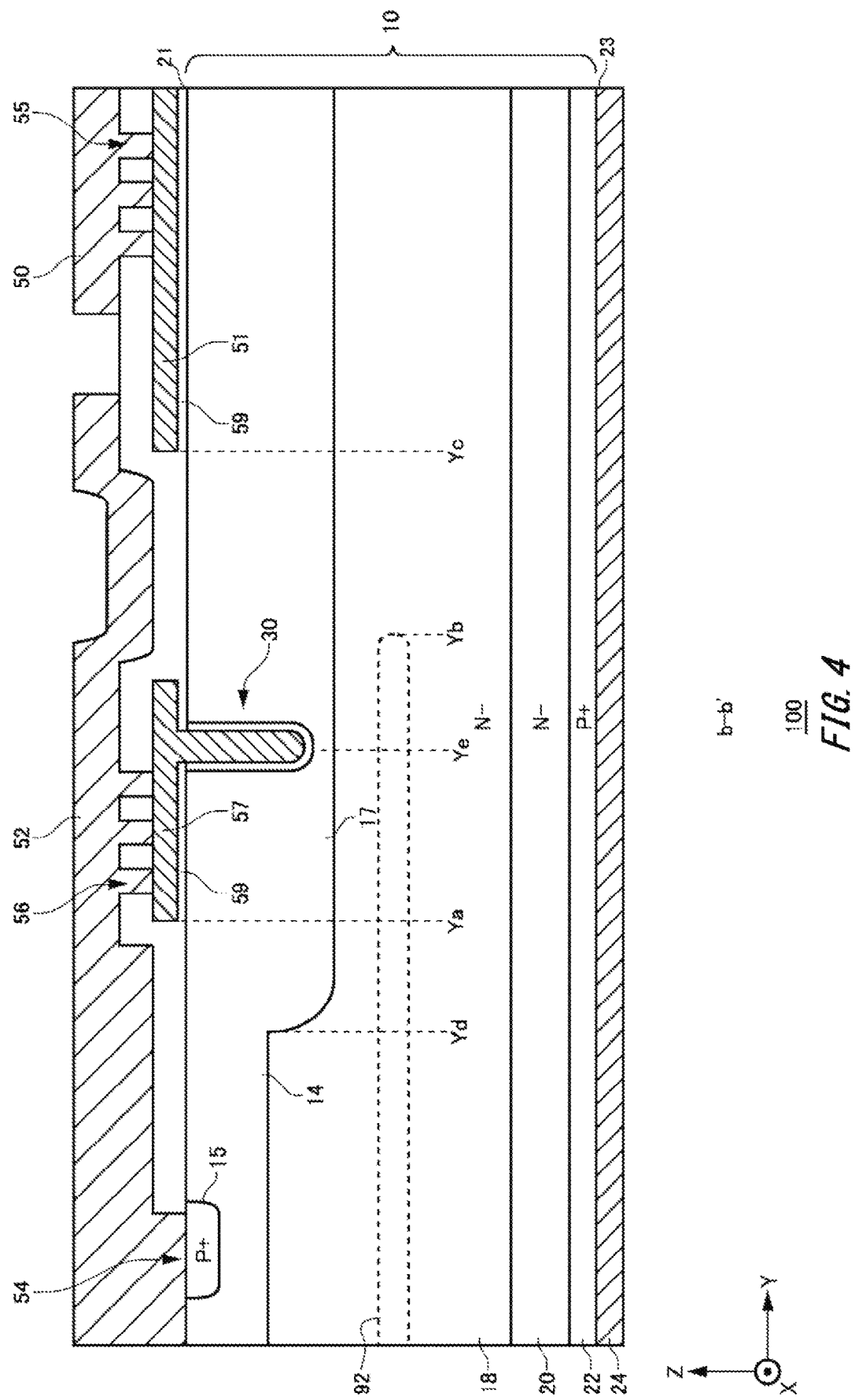
FIG. 4 is a drawing showing one example in a cross-section b-b' of the semiconductor device 100 shown in FIG. 2.

FIG. 4 is a drawing showing one example in a cross-section b-b' of the semiconductor device 100 shown in FIG. 2. The cross-section b-b' is a cross-section that is parallel to an Y-Z plane, and passes through the contact hole 54 of the boundary section 90. Additionally, though the cross-section of the boundary section 90 is shown in FIG. 4, the diode section 80 may have a similar cross-section. Note that though the boundary section 90 has the collector region 22 on the lower surface 23 side of the semiconductor substrate 10, the diode section 80 has the cathode region 82 in at least a partial region on the lower surface 23 side of the semiconductor substrate 10.

The boundary section 90 has the base region 14, the contact region 15 and the well region 17 on the upper surface 21 side of the semiconductor substrate 10. The contact region 15 is selectively formed in the base region 14. The well region 17 is formed in an outer side than the base region 14 in the longitudinal direction of the trench portion, and to a deeper position than that of the base region 14.

The dummy trench portion 30 is formed in the well region 17 in the cross-section. The lower end of the dummy trench portion 30 is formed to be shallower than the lower end of the well region 17. The dummy conductive portion of the dummy trench portion 30 is connected to the emitter electrode 52 through the connecting portion 57 and the contact hole 56. An insulating film 59 such as an oxide film may be formed between the connecting portion 57 and the semiconductor substrate 10.

The gate runner portion 51 is provided in an outer side than the base region 14 in the longitudinal direction of the trench portion. The gate runner portion 51 may be provided in a region overlapped with the well region 17. At least a part of the gate runner portion 51 is provided under the gate metal layer 50. The gate runner portion 51 is connected to the gate metal layer 50 via the contact hole 55. The insulating film 59 such as an oxide film may be formed between the gate runner portion 51 and the semiconductor substrate 10.

The upper-surface-side lifetime reduction region 92 is formed below the base region 14. The upper-surface-side lifetime reduction region 92 may be formed below the dummy trench portion 30. The upper-surface-side lifetime reduction region 92 may be formed below the lower end of the well region 17, and may be formed above the lower end of the well region 17.

In the cross-section, the upper-surface-side lifetime reduction region 92 is formed to an outer side than the base region 14 of the diode section 80 and the boundary section 90. That is, the end portion position Yb of the upper-surface-side lifetime reduction region 92 is arranged in a more outer side than an end portion position Yd of the base region 14 in the Y-axis direction. In a surface parallel to the upper surface 21 of the semiconductor substrate 10, the region of the present example provided with the upper-surface-side lifetime reduction region 92 has a portion overlapped with the well region 17. In this way, the lifetime of the holes injected in a lower side of the base region 14 from a lower side of the well region 17 can be appropriately controlled, so that the injection of the holes from the well region 17 having a higher concentration than that of the base region 14 can be suppressed.

Note that preferably, the region provided with the upper-surface-side lifetime reduction region 92 is not overlapped with the gate runner portion 51 in a surface parallel to the upper surface 21 of the semiconductor substrate 10. In this way, in a case where helium ions or the like is irradiated, damage to the gate insulating film 59 of the gate runner portion 51 can be suppressed. That is, a leak current to be generated between the gate metal layer 50 and the emitter electrode 52 is suppressed, which can prevent gate insulation breakdown.

When the end portion position of the gate runner portion 51 on the base region 14 side is denoted as Yc, the end portion position Yb of the upper-surface-side lifetime reduction region 92 is preferably arranged between the end portion position Yd of the base region 14 and an end portion position Yc of the gate runner portion 51. Also, a position of the dummy trench portion 30 in the cross-section is denoted as Ye, and an end portion position of the connecting portion 57 in the base region 14 side is denoted as Ya. The end portion position Yb may be arranged between the position Ye and the position Yd, and may be arranged between the position Ya and the position Yd. When the end portion position Yb is arranged between the position Ya and the position Yd, damage to the connecting portion 57 can also be suppressed.

In the present example, the end portion position Yb is arranged between the position Yc and the position Ye. The edge termination structure portion is located in an outer peripheral side than the gate runner portion 51. When the diode section 80 performs a reverse recovery operation, excessive carriers exuded in an edge termination structure portion side crowd at an end portion 60 of the contact hole 54 of the diode section 80 or the boundary section 90. The existence of the dummy trench portion 30 works as a physical barrier in cases of exuding the excessive carriers toward the outer peripheral side and of traveling the carriers toward the end portion of the contact hole during reverse recovery. In this way, the excessive carriers can be suppressed from crowding at the end portion of the contact hole 54. Moreover, when the end portion position Yb of the upper-surface-side lifetime reduction region 92 is located in a more outer peripheral side (position Yc side) than the position Ye of the dummy trench portion 30, the exuding of the excessive carriers toward the outer peripheral side and the crowding of the carriers to the end portion of the contact hole 54 can be further suppressed.

Figure 5:
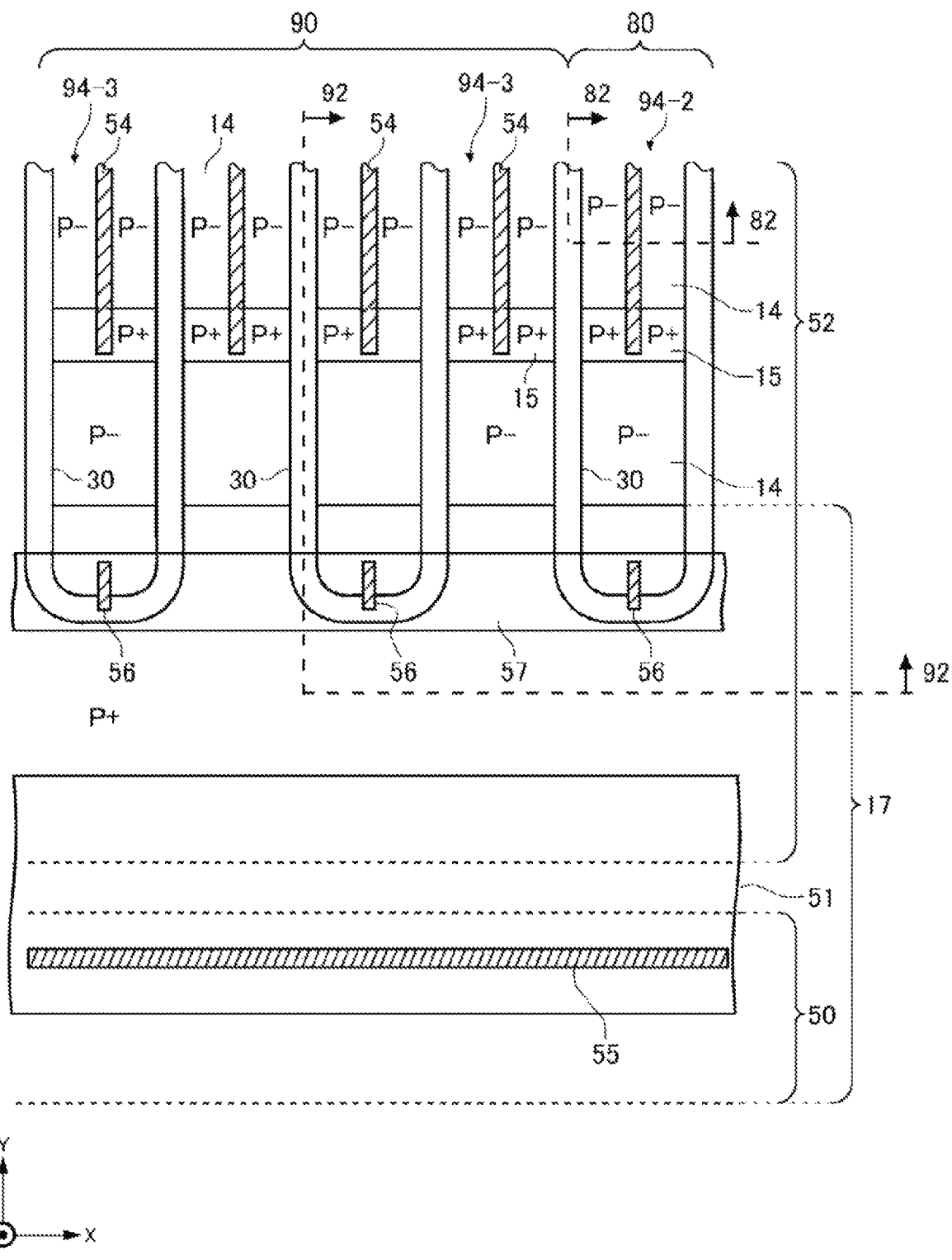
FIG. 5 is a drawing showing a position of a cathode region 82 in a surface parallel to an upper surface of a semiconductor substrate 10.

In the semiconductor device 100 shown in FIG. 2, FIG. 5 is a drawing showing a position of the cathode region 82 in a surface parallel to the upper surface 21 of the semiconductor substrate 10. The cathode region 82 is provided in the region of the diode section 80. In the short direction of the trench portion (X-axis direction), the cathode region 82 is formed in the whole diode section 80. In the longitudinal direction of the trench portion (Y-axis direction), the cathode region 82 is formed in a partial region of the mesa portion. For example, the cathode region 82 is formed in an inner side than the contact region 15 in the most outer side (gate runner portion 51 side).

In a surface parallel to the upper surface 21 of the semiconductor substrate 10, the upper-surface-side lifetime reduction region 92 is provided to cover a region wider than the cathode region 82 of the diode section 80. As shown in FIG. 3 to FIG. 5, the upper-surface-side lifetime reduction region 92 is provided in a range wider than the cathode region 82 in both the X-axis direction and the Y-axis direction. In this way, the lifetime of the holes injected thereinto from an outer side of the cathode region 82 can be appropriately controlled, The upper-surface-side lifetime reduction region 92 may be provided to cover a region wider than the base region 14 of the diode section 80 in a surface parallel to the upper surface 21 of the semiconductor substrate 10. As shown in FIG. 3 and FIG. 4, the upper-surface-side lifetime reduction region 92 is also formed in the boundary section 90 in the X-axis direction, and is also formed in the well region 17 in the Y-axis direction.

Figure 6:
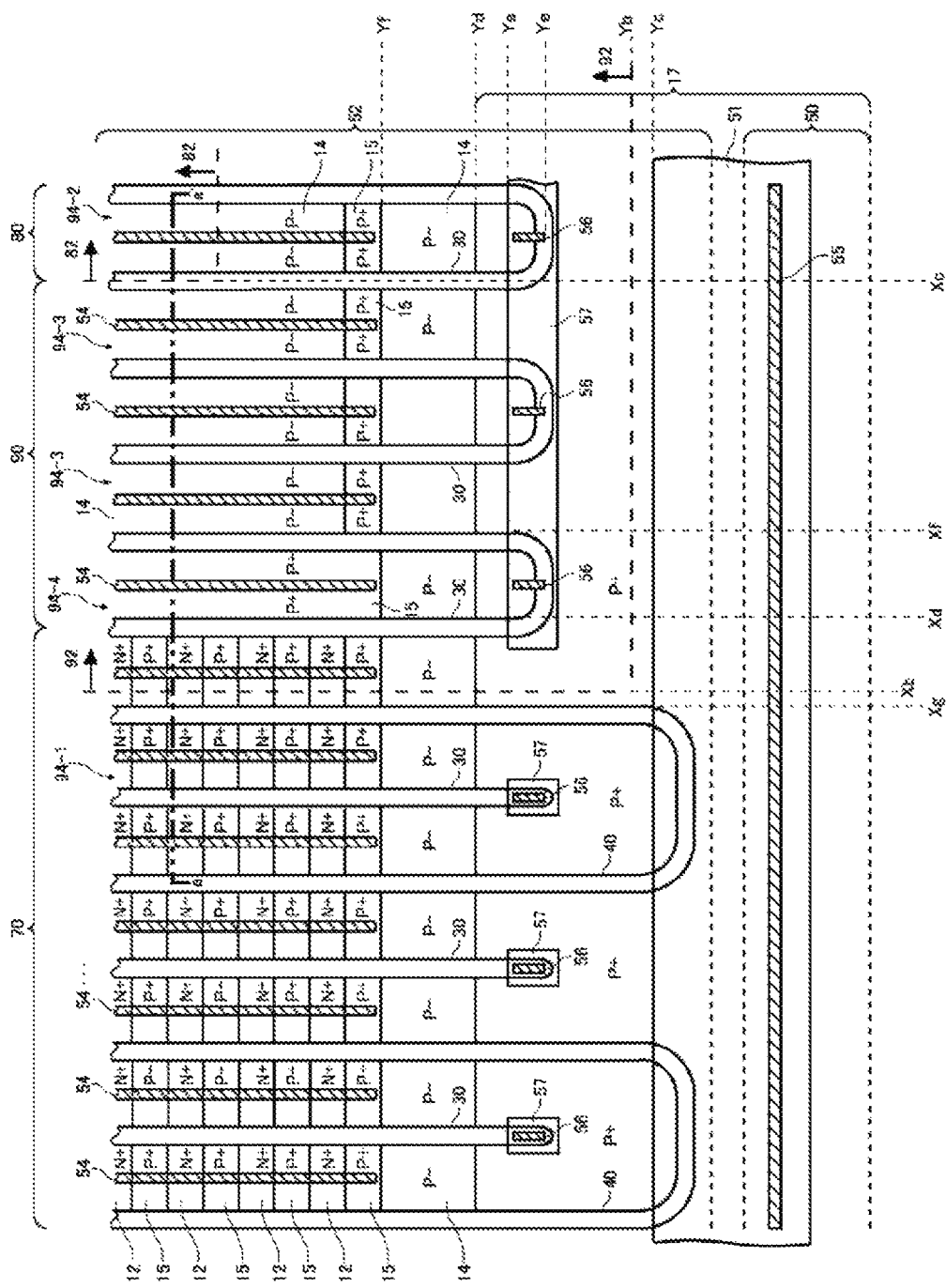
FIG. 6 is a drawing showing another example of a range in which an upper-surface-side lifetime reduction region 92 is provided.

FIG. 6 is a drawing showing another example in a range in which the upper-surface-side lifetime reduction region 92 is provided. Note that the boundary section 90 of the present example has a boundary mesa portion 94-3 and a drawing mesa portion 94-4. As one example, the boundary mesa portion 94-3 is arrange in a region adjacent to the diode section 80, and the drawing mesa portion 94-4 is arranged in a region adjacent to the transistor section 70. In another example, the boundary mesa portion 94-3 is arrange in a region adjacent to the transistor section 70, and the drawing mesa portion 94-4 may be arranged in a region adjacent to the diode section 80.

In the drawing mesa portion 94-4, there is provided the contact region 15 having an area larger than that of the contact region 15 of the mesa portion 94-1 in the transistor section 70. The contact region 15 of the drawing mesa portion 94-4 has an area larger than that of the contact region 15 provided at the mesa portion 94-2 in the diode section 80. The drawing mesa portion 94-4 may not be provided with the emitter region 12.

In the same arrangement as that of the mesa portion 94-2 of the diode section 80, the base region 14 and the contact region 15 are provided in the boundary mesa portion 94-3. Note that the collector region 22 is provided on the lower surface of the semiconductor substrate 10 in the boundary mesa portion 94-3.

In the present example, among the gate trench portions 40 in the transistor section 70, in the gate trench portion 40 that is arranged nearest to the diode section 80 side, a position of the end portion thereof in the diode section 80 side in the X-axis direction is denoted as Xg. In the drawing mesa portion 94-4 that is arranged nearest to the transistor section 70 side, a position of the end portion thereof in the transistor section 70 side in the X-axis direction is denoted as Xd. The position Xd may be a boundary position between the drawing mesa portion 94-4 and the dummy trench portion 30. In the boundary mesa portion 94-3 that is arranged nearest to the transistor section 70 side, a position of the end portion thereof in the transistor section 70 side in the X-axis direction is denoted as Xf. The position Xf may be a boundary position between the boundary mesa portion 94-3 and the dummy trench portion 30. In the X-axis direction, a position of the end portion of the cathode region 82 is denoted as Xc. In the X-axis direction, a position of the end portion of the upper-surface-side lifetime reduction region 92 is denoted as Xb.

The end portion position Xb of the upper-surface-side lifetime reduction region 92 in the X-axis direction is arranged nearer to a diode section 80 side than the gate trench portion 40 (position Xg) that is arranged nearest to the diode section 80 side in the transistor section 70, and arranged nearer to the transistor section 70 side than the cathode region 82 (position Xc). As shown in FIG. 6, the upper-surface-side lifetime reduction region 92 may be formed in a part of the transistor section 70. Note that the upper-surface-side lifetime reduction region 92 is not provided in a region that is overlapped with the gate trench portion 40 of the transistor section 70 in a surface parallel to the upper surface 21 of the semiconductor substrate 10.

The end portion position Xb in the upper-surface-side lifetime reduction region 92 of the present example is arranged in the mesa portion 94-1 that is arranged nearest to the diode section 80 side in the transistor section 70. Note that the end portion position Xb in the upper-surface-side lifetime reduction region 92 is arranged nearer to the diode section 80 side than the end portion position Xg in the gate trench portion 40. A distance between the end portion position Xb and the end portion position Xg is preferably larger than a width in the X-axis direction of the channel region formed in the base region 14 when an ON voltage is applied to the gate trench portion 40. In this way, an effect of the upper-surface-side lifetime reduction region 92 on the threshold voltage of the transistor can be reduced. As one example, the distance between the end portion position Xb and the end portion position Xg may be equal to or longer than 0.1 µm, and may be equal to or longer than 0.2 µm. Also, the distance between the end portion position Xb and the end portion position Xg may be half or less of the width of the mesa portion 94-1 in the X-axis direction. With such an arrangement, the upper-surface-side lifetime reduction region 92 can be arranged in a wide range while the effect to the channel is suppressed.

Figure 7:
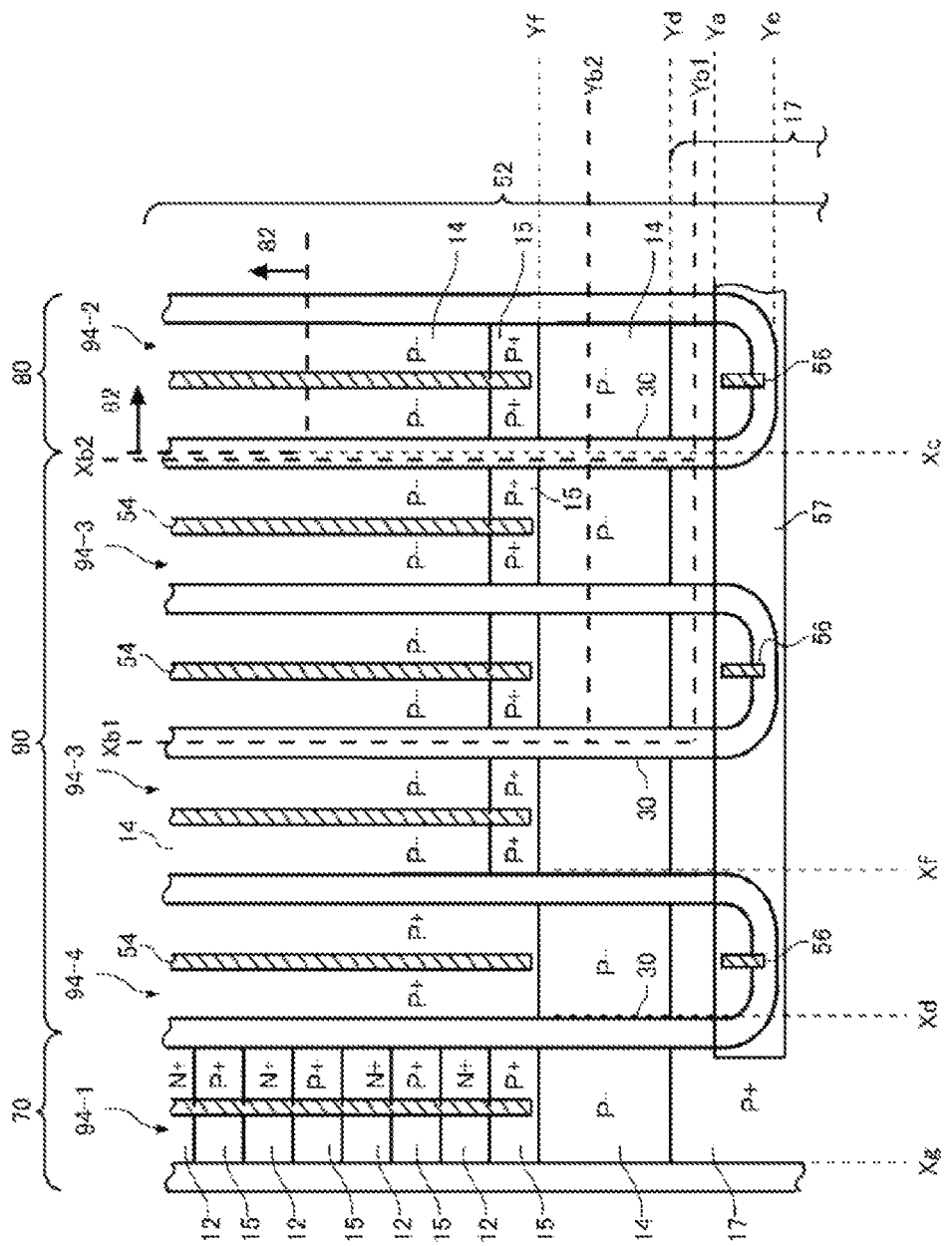
FIG. 7 is a drawing showing another example of the range in which the upper-surface-side lifetime reduction region 92 is provided.

FIG. 7 is a drawing showing another example of a range in which the upper-surface-side lifetime reduction region 92 is provided. In FIG. 7, the vicinity of the boundary section 90 is shown with magnification. The end portion position Xb of the upper-surface-side lifetime reduction region 92 in the X-axis direction may be arranged between the end portion position Xd of the drawing mesa portion 94-4 and the end portion position Xc of the cathode region 82. In this way, when the transistor section is in an ON state, it is prevented that the concentration of the holes that flows in the mesa portion 94 in direct contact with the gate trench portion 40 is reduced by the upper-surface-side lifetime reduction region 92, so that an increase of the ON voltage can be prevented. Moreover, by a configuration that the upper-surface-side lifetime reduction region 92 is provided for the mesa portion 94-4 in a top view, when the diode section 80 is in an ON state, the injection of the holes having a high concentration from the mesa portion 94-4 toward the cathode region 82 can be suppressed.

The end portion position Xb of the upper-surface-side lifetime reduction region 92 in the X-axis direction may be arranged between the end portion position Xd and the end portion position Xf of the boundary mesa portion 94-3 nearest to the transistor section 70 side. In this way, when the transistor section 70 is turned on, it is prevented that the hole concentration is further reduced by the upper-surface-side lifetime reduction region 92, so that an increase of the ON voltage can be prevented.

The end portion position Xb of the upper-surface-side lifetime reduction region 92 in the X-axis direction may be arranged between the end portion position Xf and the end portion position Xc of the cathode region 82 (for example, position Xb1). With respect to a misalignment of a mask in a selective injection of the lifetime killer, it can be prevented that the lifetime killer reaches the gate trench portion 40.

Also, the end portion position Xb of the upper-surface-side lifetime reduction region 92 in the X-axis direction may be arranged in the vicinity of the end portion position Xc of the cathode region 82 (for example, position Xb2). As one example, a distance between the end portion position Xb and the end portion position Xc in the X-axis direction may be smaller than a width of the dummy trench portion 30 in the X-axis direction. With respect to the misalignment of the mask in the selective injection of the lifetime killer, it can be further prevented that the lifetime killer reaches the gate trench portion 40.

As shown in FIG. 4 and FIG. 6, the end portion position Yb of the upper-surface-side lifetime reduction region 92 in the Y-axis direction may be arranged between the end portion position Yc of the gate runner portion 51 and a position Ye of the dummy trench portion 30. In another example, as shown in FIG. 7, the end portion position Yb of the upper-surface-side lifetime reduction region 92 in the Y-axis direction may be arranged between an end portion position Ya of the gate connecting portion 57 and an end portion position Yf of the contact region 15 in the Y-axis direction. The end portion position Yf is an end portion position of the contact region 15 on a negative side in the Y-axis direction, the contact region 15 being provided at the end portion in the Y-axis direction in the diode section 80. With respect to a misalignment of a mask in a selective injection of the lifetime killer, it can be prevented that the lifetime killer reaches the gate runner portion 51.

The end portion position Yb of the upper-surface-side lifetime reduction region 92 in the Y-axis direction may be arranged between the end portion position Ya of the connecting portion 57 and the end portion position Yd of the base region 14 (for example, end portion position Yb1). Since the upper-surface-side lifetime reduction region 92 is overlapped with the well region 17 in a top view, it can be prevented that holes having a high concentration is injected from the well region 17 toward the cathode region 82.

The end portion position Yb of the upper-surface-side lifetime reduction region 92 in the Y-axis direction may be arranged between the end portion position Yd and the end portion position Yf of the base region 14 (for example, end portion position Yb2). With respect to a misalignment of a mask in a selective injection of the lifetime killer, it can be prevented more surely that the lifetime killer reaches the gate runner portion 51.

Figure 8:
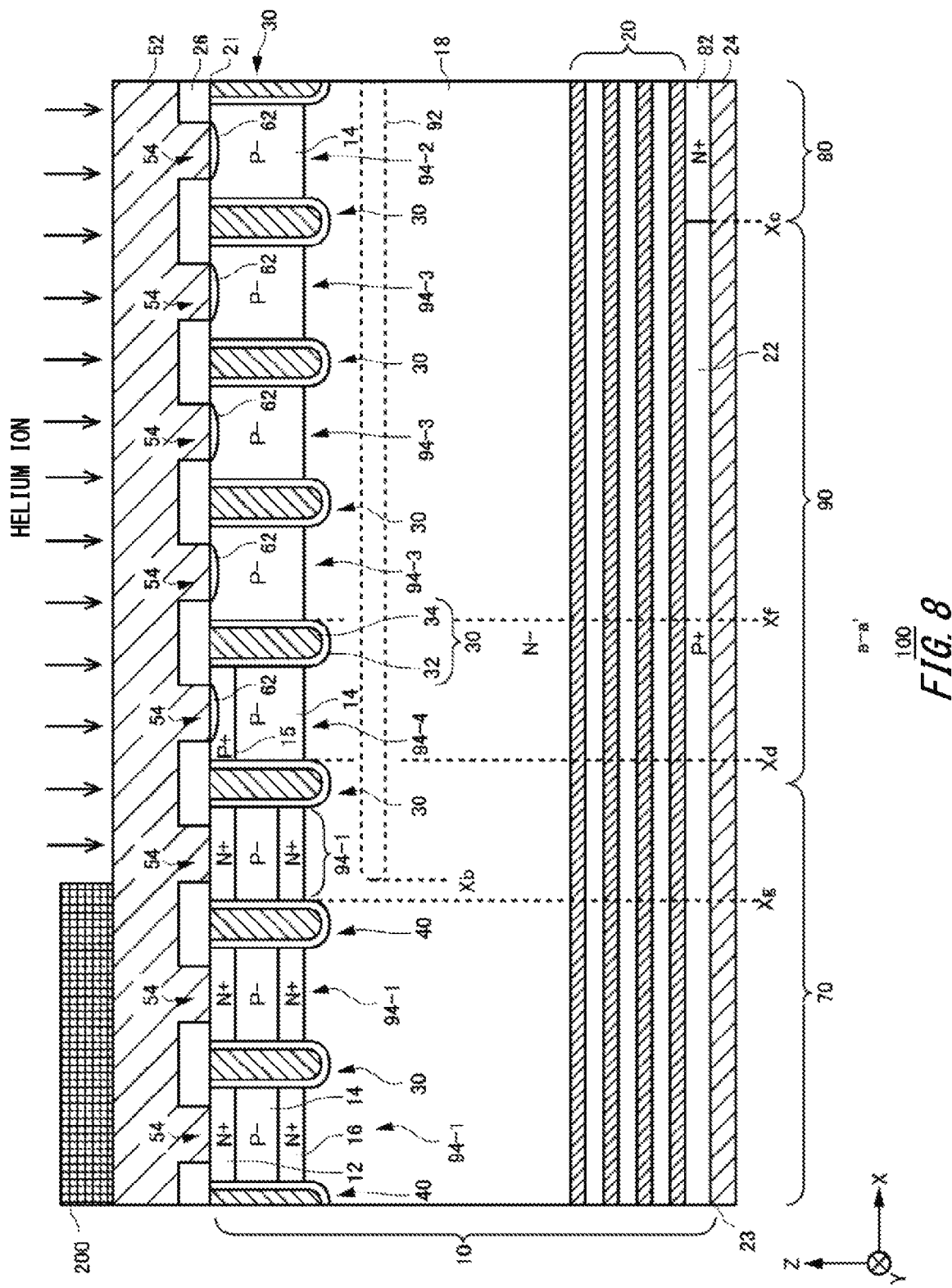
FIG. 8 is a drawing showing one example in a cross-section a-a' of FIG. 6.

FIG. 8 is a drawing showing one example in a cross-section a-a' of FIG. 6. In FIG. 8, a mask 200 to be used in a manufacture of the semiconductor device 100 is shown together. Additionally, the diode section 80 and the boundary section 90 of the present example may have a contact region 62 at a portion exposed by the contact hole 54 on the upper surface of each mesa portion 94. The contact region 62 is a region having a higher concentration than that of the contact region 15.

As shown in FIG. 6, the end portion position Xb of the upper-surface-side lifetime reduction region 92 in the X-axis direction is arranged between the end portion position Xg of the gate trench portion 40 nearest to the diode section 80 side in the transistor section 70 and the end portion position Xd of the drawing mesa portion 94-4. Note that the end portion position Xb is separated from the end portion position Xg on the drawing mesa portion 94-4 side by a predetermined distance. The distance is longer than a width of a channel region formed in the base region 14 in the X-axis direction.

The upper-surface-side lifetime reduction region 92 is provided in the drift region 18 at a depth position nearer to the upper surface 21 side than the intermediate position of the semiconductor substrate 10 in the depth direction. The upper-surface-side lifetime reduction region 92 is a region that contains the crystal defect. As described above, the crystal defect may be a defect that becomes the recombination center, and may be, for example, a vacancy, a divacancy, a dislocation, an interstitial atom, a helium atom, a metal atom and the like.

In the X-axis direction, the upper-surface-side lifetime reduction region 92 is formed over the diode section 80 and the boundary section 90, and further may be formed in one or more mesa portions 94-1 in the transistor section 70. Also, in the Y-axis direction, the upper-surface-side lifetime reduction region 92 may be arranged to cover the whole dummy trench portion 30 in order to include at least an end of the dummy trench portion 30 in an extending direction.

Figure 9:
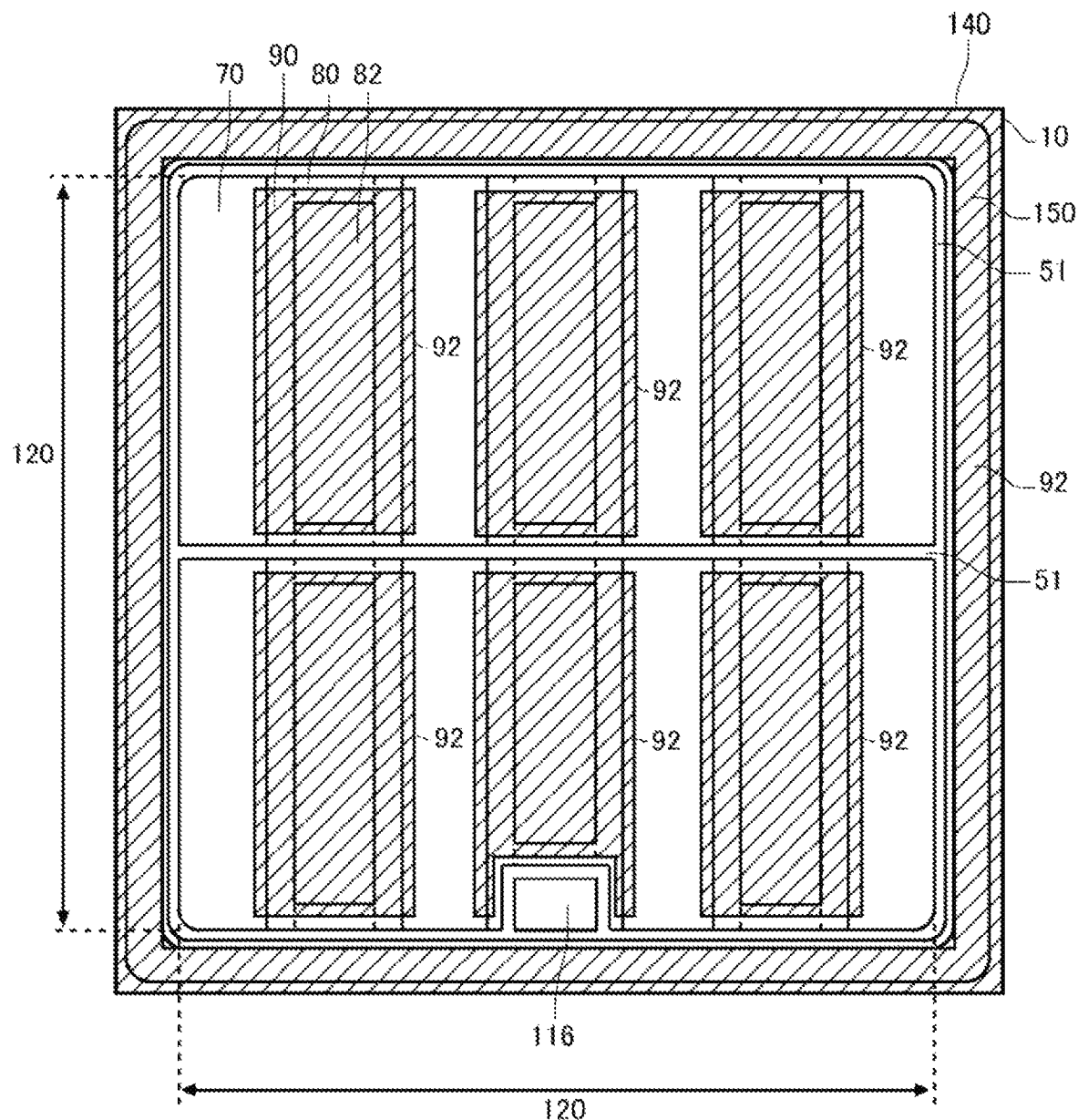
FIG. 9 is a drawing showing an arrangement example of the upper-surface-side lifetime reduction region 92 on the upper surface of the semiconductor substrate 10.

FIG. 9 is a drawing showing an arrangement example of the upper-surface-side lifetime reduction region 92 on the upper surface of the semiconductor substrate 10. As shown in FIG. 1, the transistor section 70, the diode section 80 and the boundary section 90 are arranged in the active portion 120.

In the active portion 120, the upper-surface-side lifetime reduction region 92 is arranged to cover the whole cathode region 82. In the X-axis direction, the upper-surface-side lifetime reduction region 92 is provided over the diode section 80 and the boundary section 90. In the Y-axis direction, the upper-surface-side lifetime reduction region 92 is arranged to be separated from the gate runner portion 51. A distance between the upper-surface-side lifetime reduction region 92 in the Y-axis direction and the gate runner portion 51 may be equal to or longer than 10 and equal to or shorter than 30 µm.

The upper-surface-side lifetime reduction region 92 may be also arranged in a part of the transistor section 70. Note that the upper-surface-side lifetime reduction region 92 is arranged so as not to be overlapped with the gate insulating film 42. In this way, damage to the gate insulating film 42 due to irradiation of helium ions or the like can be suppressed. On the other hand, the upper-surface-side lifetime reduction region 92 may be arranged to be overlapped with the dummy insulating film 32.

Note that the upper-surface-side lifetime reduction region 92 is preferably arranged so as not to be also overlapped with the gate pad 116. In this way, the insulating film provided between the gate pad 116 and the semiconductor substrate 10 can be protected.

Also, in a surface parallel to the upper surface 21 of the semiconductor substrate 10, the upper-surface-side lifetime reduction region 92 may be also arranged between the gate runner portion 51 and the gate metal layer 50, and the outer peripheral edge 140 of the semiconductor substrate 10. In the present example, the upper-surface-side lifetime reduction region 92 is arranged to cover the whole edge termination structure portion 150. The upper-surface-side lifetime reduction region 92 that covers the edge termination structure portion 150, and the upper-surface-side lifetime reduction region 92 arranged in the active portion 120 is separated in a top view so as not to be overlapped with the gate runner portion 51 and the gate metal layer 50 in the top view. When the upper-surface-side lifetime reduction region 92 is also provided in the edge termination structure portion 150, a movement of carriers is suppressed from an edge portion of the semiconductor substrate 10 to the active portion 120 during reverse recovery, so that reverse recovery resistance can be improved.

Figure 10:
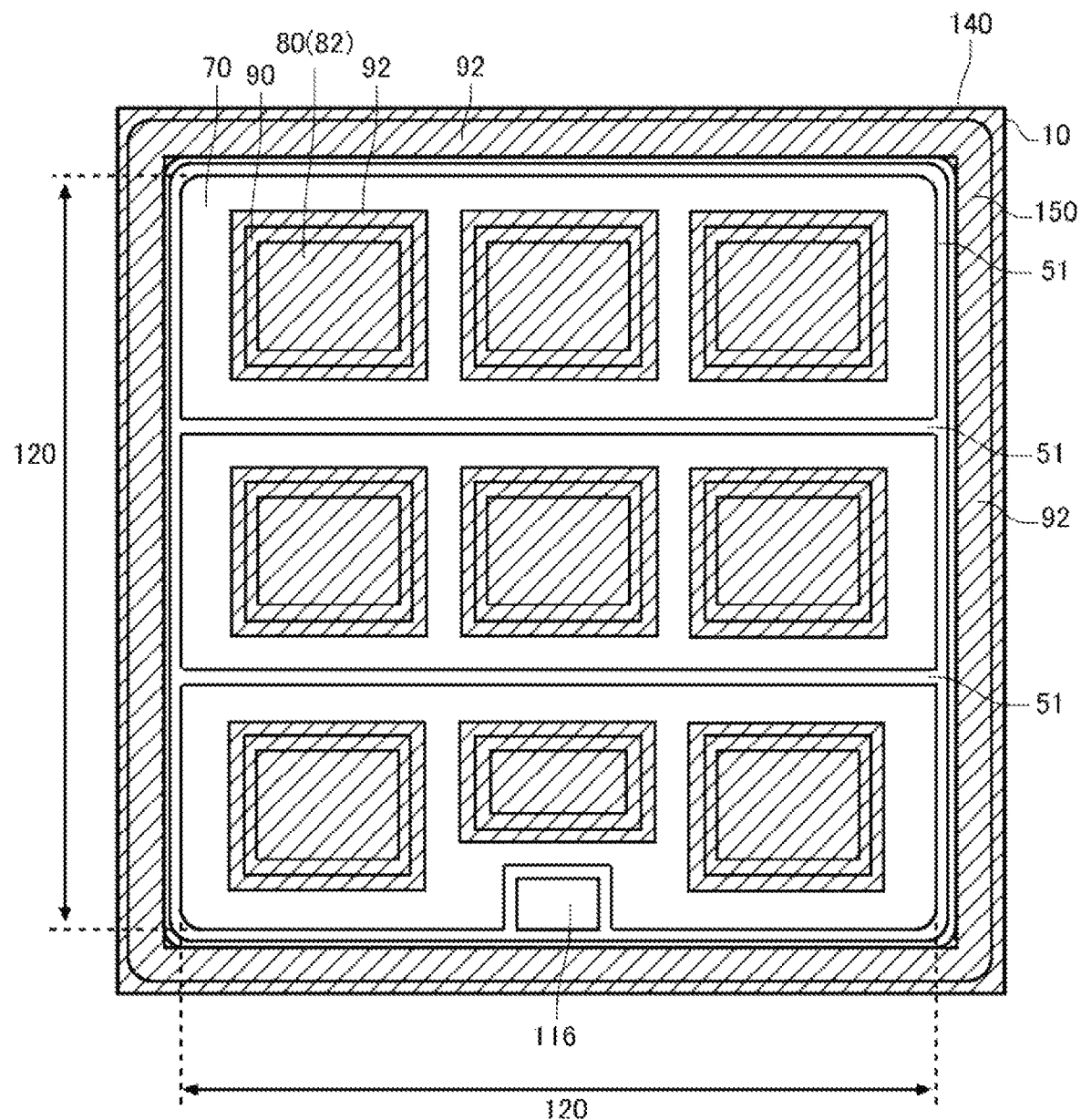
FIG. 10 is a drawing showing another exemplary structure on the upper surface of the semiconductor substrate 10.

FIG. 10 is a drawing showing another exemplary structure on the upper surface of the semiconductor substrate 10. In the present example, in a surface parallel to the upper surface of the semiconductor substrate 10, the diode section 80 and the boundary section 90 are arranged to be surrounded by the transistor section 70. More specifically, the diode section 80 is surrounded by the boundary section 90, and the boundary section 90 is surrounded by the transistor section 70. Note that a range of the diode section 80 of the present example matches with a range provided with the cathode region 82.

The upper-surface-side lifetime reduction region 92 of the present example is arranged to cover the whole of the diode section 80 and the boundary section 90. The upper-surface-side lifetime reduction region 92 may be also arranged in a part of the transistor section 70. The upper-surface-side lifetime reduction region 92 may be arranged dividedly corresponding to individual diode sections 80 arranged dividedly in a top view.

Figure 11:
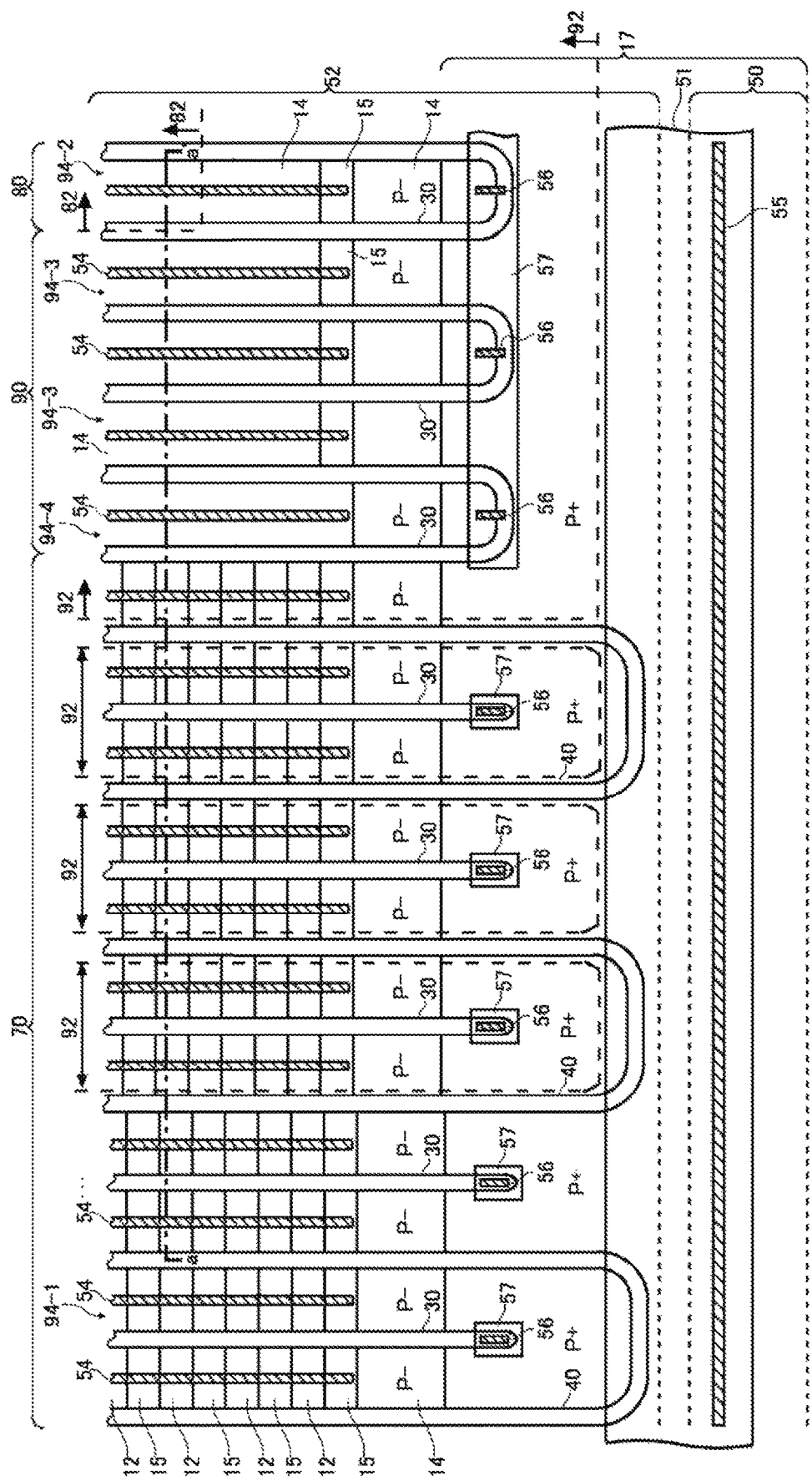
FIG. 11 is a drawing showing another arrangement example of the upper-surface-side lifetime reduction region 92.

FIG. 11 is a view showing another arrangement example of the upper-surface-side lifetime reduction region 92. The upper-surface-side lifetime reduction region 92 of the present example is provided in the plurality of mesa portions 94-1 arranged at an end portion of the transistor section 70 in the X-axis direction. Note that the upper-surface-side lifetime reduction region 92 may be provided so as not to be overlapped with the gate trench portion 40. In other words, in a top view, the upper-surface-side lifetime reduction regions 92 are provided in one or more mesa portions 94-1 sandwiched between gate trench portions 40 adjacent to each other, and further the upper-surface-side lifetime reduction region 92 is separated from the gate trench portion in the top view. A mesa portion 94-1 not provided with the upper-surface-side lifetime reduction region 92 exists between the upper-surface-side lifetime reduction region 92 and the gate trench portion, the mesa portion 94-1.

The upper-surface-side lifetime reduction region 92 may be provided to be overlapped with the dummy trench portion 30 in the transistor section 70. The upper-surface-side lifetime reduction region 92 of the present example is provided, across the dummy trench portion 30 in the X-axis direction, from a vicinity of one gate trench portion 40 to a vicinity of anther gate trench portion 40. As described above, the upper-surface-side lifetime reduction region 92 is separated from the gate trench portion 40 by a width or more of the channel region.

Note that the upper-surface-side lifetime reduction region 92 is not provided in at least one mesa portion 94-1. The number of the mesa portions 94-1 not provided with the upper-surface-side lifetime reduction region 92 may be higher than that of the mesa portions 94-1 provided with the upper-surface-side lifetime reduction region 92.

An end portion position of the upper-surface-side lifetime reduction region 92 in the transistor section 70 in the Y-axis direction may be the same as an end portion position of the upper-surface-side lifetime reduction region 92 in the diode section 80 in the Y-axis direction. In the Y-axis direction, the upper-surface-side lifetime reduction region 92 in the transistor section 70 may be provided to be overlapped with the emitter region 12, the contact region 15, the base region 14 and the well region 17. Note that the upper-surface-side lifetime reduction region 92 is arranged so as not to be overlapped with the gate runner portion 51 and the gate metal layer 50. In this way, the gate insulating film formed under the gate runner portion 51 and the gate metal layer 50 can be protected.

An end portion position of the upper-surface-side lifetime reduction region 92 in the Y-axis direction may be the same as any of those described in FIG. 1 to FIG. 10. As one example, the upper-surface-side lifetime reduction region 92 is provided to cover the whole of at least one dummy trench portion 30 in the transistor section 70.

Figure 12:
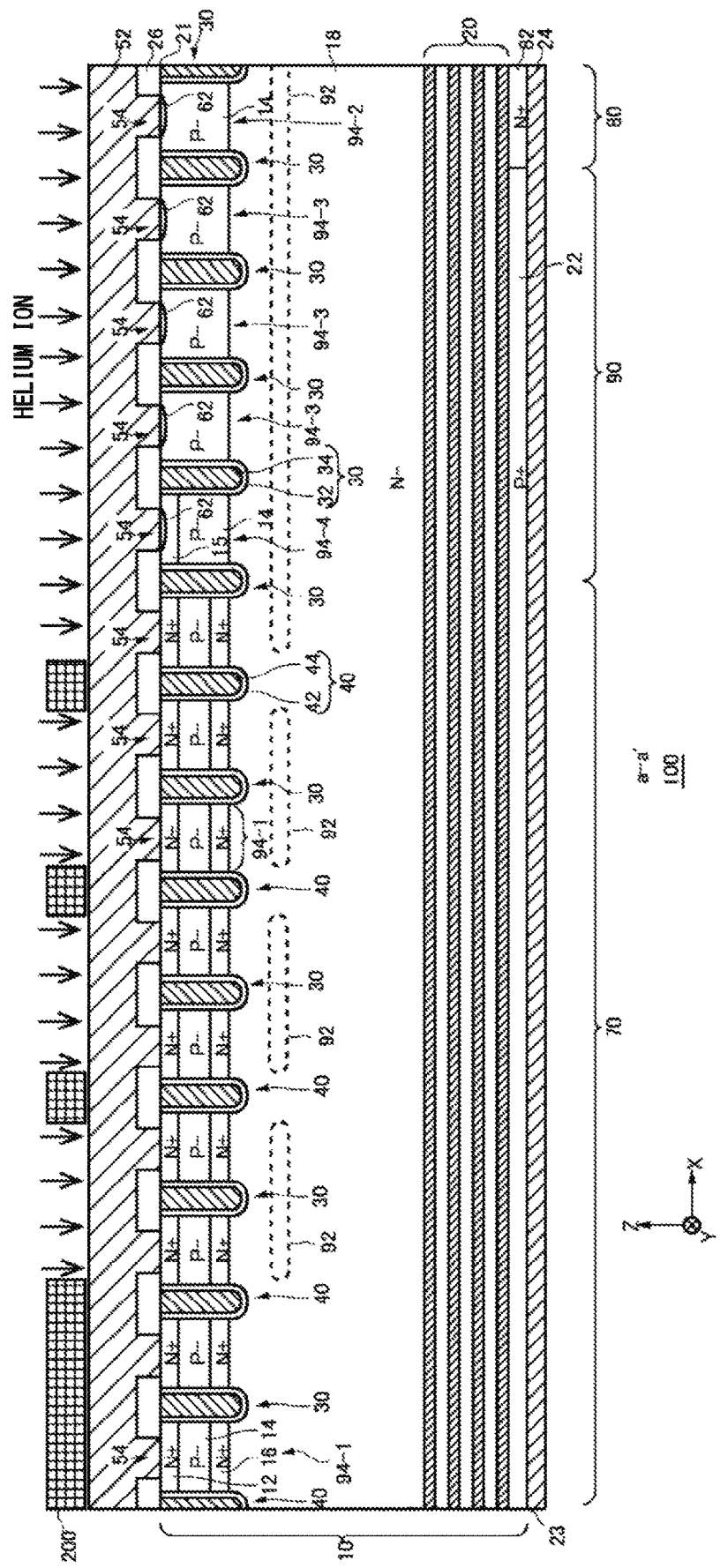
FIG. 12 is a drawing showing one example in a cross-section a-a' of FIG. 11.

FIG. 12 is a view showing one example in a cross-section a-a' of FIG. 11. In FIG. 12, a mask 200 to be used in a manufacture of the semiconductor device 100 is shown together. In the present example, the mask 200 is arranged for one or more gate trench portions 40 in the end portion of the transistor section 70, while the mask 200 is not arranged for one or more mesa portions 94-1 and one or more dummy trench portions 30. The mask 200 is arranged such that the upper-surface-side lifetime reduction region 92 is arranged to be separated from the gate trench portion 40 by a channel width or more. A width in the X-axis direction of the mask 200 that is arranged over the gate trench portion 40 is larger than the sum of a width of the gate trench portion 40 and twice of a channel width in the X-axis direction (for example, about 0.1 μm).

Figure 13:
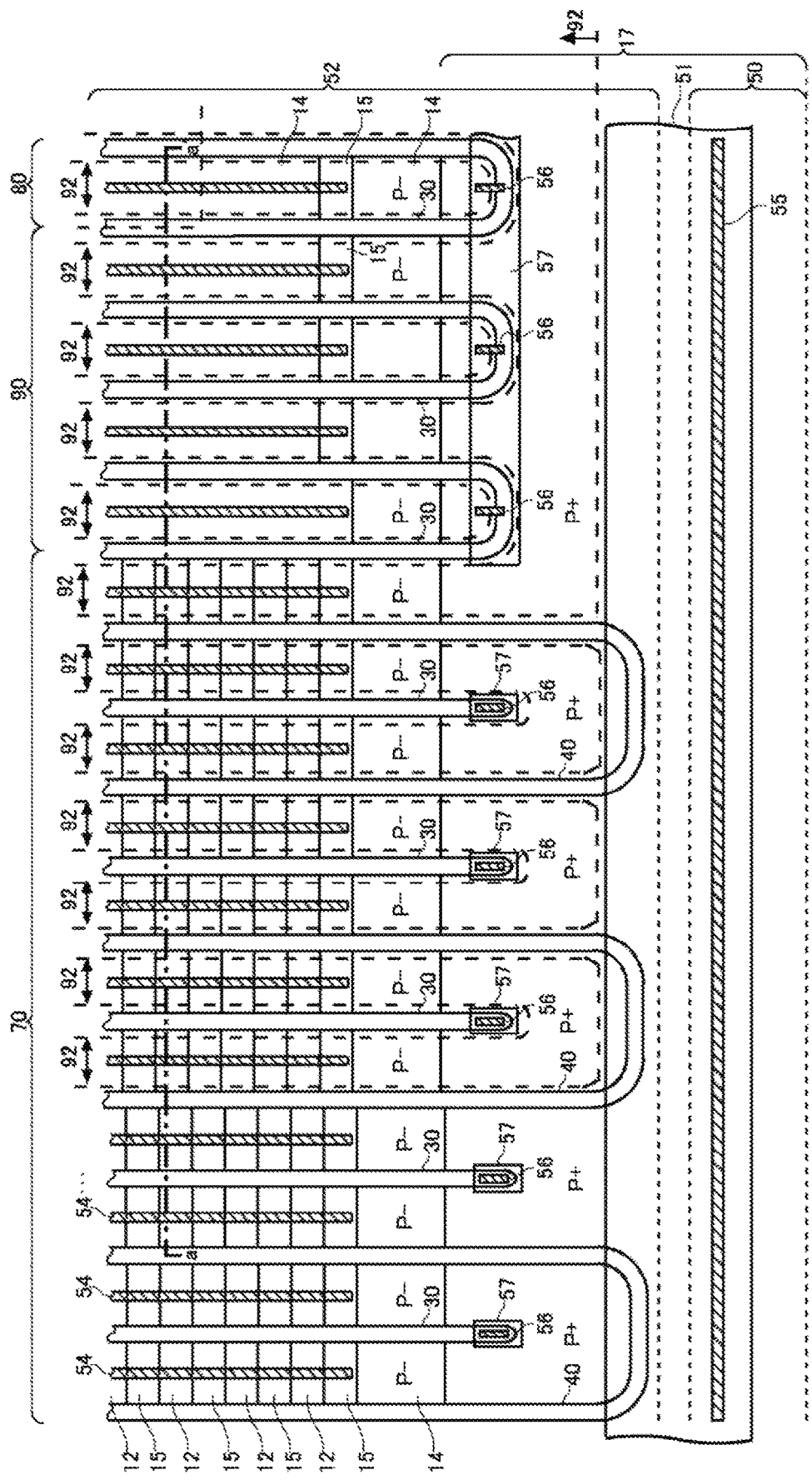
FIG. 13 is a drawing showing another arrangement example of the upper-surface-side lifetime reduction region 92.

FIG. 13 is a drawing showing another arrangement example of the upper-surface-side lifetime reduction region 92. As compared to the example shown in FIG. 11, there is a difference in that the upper-surface-side lifetime reduction region 92 of the present example does not cover the dummy trench portion 30. That is, the upper-surface-side lifetime reduction region 92 of the present example is provided in the plurality of mesa portions 94-1 arranged at an end portion of the transistor section 70 in the X-axis direction. Note that the upper-surface-side lifetime reduction region 92 may be provided so as not to be overlapped with the gate trench portion 40 and the dummy trench portion 30.

In the present example, the upper-surface-side lifetime reduction region 92 that is arranged in the mesa portion 94-1 of the transistor section 70 is arranged in a circular pattern in a top view. The dummy trench portion 30 is arranged in a region surrounded by the upper-surface-side lifetime reduction region 92 in a circular pattern, and the gate trench portion 40 is arranged outside the circular one.

Note that the upper-surface-side lifetime reduction regions 92 in the diode section 80 and the boundary section 90 may be provided to cover the dummy trench portion 30, similarly to the examples shown in FIG. 1 to FIG. 12, and may be provided so as not to cover the dummy trench portion 30, similarly to the transistor section 70 shown in FIG. 13. The upper-surface-side lifetime reduction regions 92 in the diode section 80 and the boundary section 90 shown in FIG. 13 is provided so as not to cover the dummy trench portion 30. A distance between the dummy trench portion 30 and the upper-surface-side lifetime reduction region 92 in the X-axis direction may be the same as that between the gate trench portion 40 and the upper-surface-side lifetime reduction region 92 in the X-axis direction.

Figure 14:
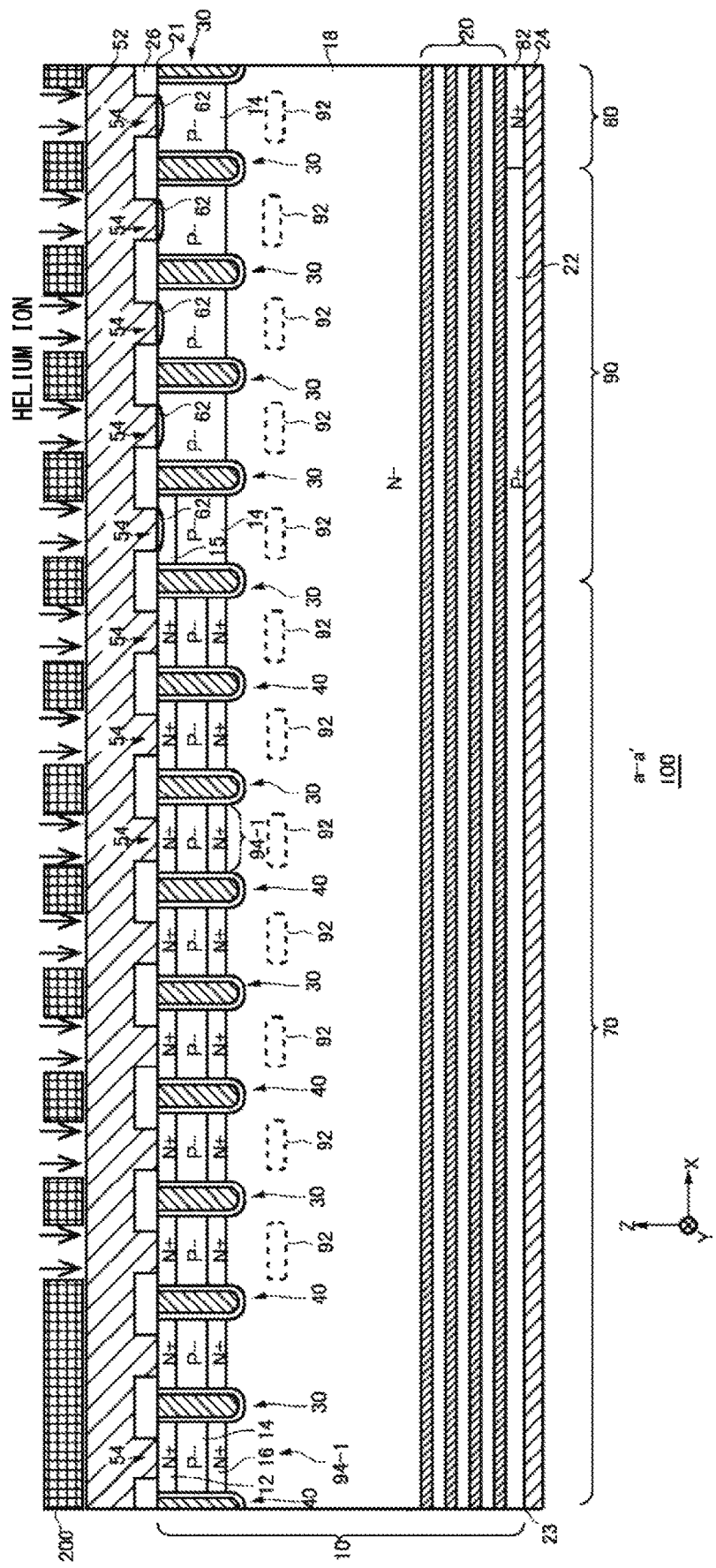
FIG. 14 is a drawing showing one example in a cross-section a-a' of FIG. 13.

FIG. 14 is a view showing one example in a cross-section a-a' of FIG. 13. In FIG. 14, a mask 200 to be used in a manufacture of the semiconductor device 100 is shown together. In the present example, the mask 200 is arranged for individual trench portions. The mask 200 is not arranged to one or more mesa portions 94-1 arranged at an end portion in the transistor section 70 in the X-axis direction. Also, the mask 200 is not arranged even for each mesa portion 94 of the diode section 80 and the boundary section 90. The mask 200 is arranged such that the upper-surface-side lifetime reduction region 92 is arranged to be separated from each trench portion by a channel width or more.

Figure 15:
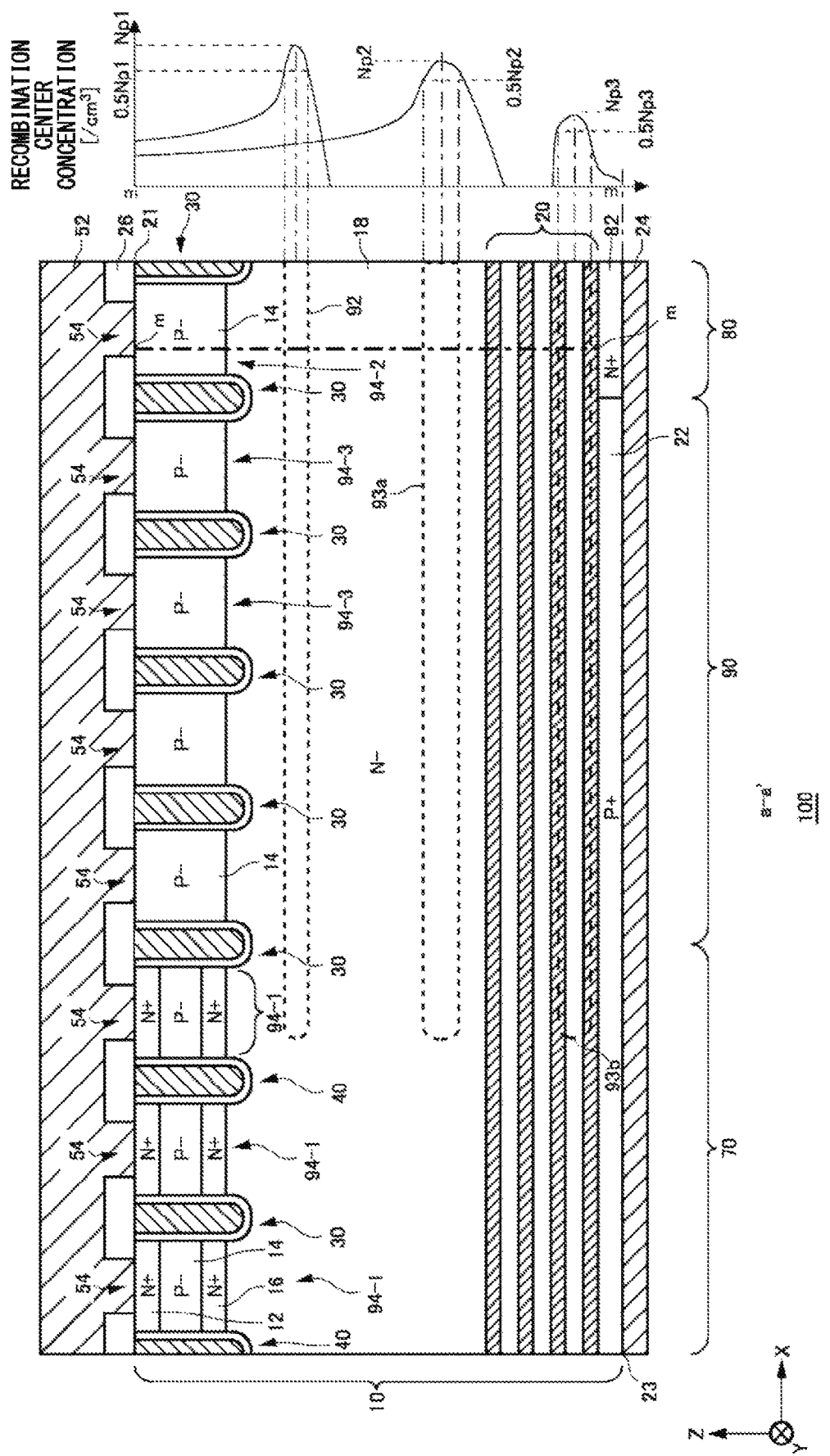
FIG. 15 is a drawing showing another example in a cross-section a-a' of FIG. 1.

FIG. 15 is a view showing another example in a cross-section a-a' of FIG. 1. The semiconductor device 100 of the present example further comprises lower-surface-side lifetime reduction region 93a, 93b for the structure of the semiconductor device 100 shown in FIG. 1 to FIG. 14. Other structures may be the same as the semiconductor device 100 in any aspect shown in FIG. 1 to FIG. 14.

The lower-surface-side lifetime reduction region 93a is arranged nearer to the lower surface 23 side than the middle of the semiconductor substrate 10 in the depth direction. In a top view, the lower-surface-side lifetime reduction region 93a may be provided in the same range as that of the upper-surface-side lifetime reduction region 92, and may be provided in a different range therefrom.

The lower-surface-side lifetime reduction region 93a may be formed by irradiation of helium and the like from the upper surface 21 side of the semiconductor substrate 10. In this case, a concentration distribution of the recombination center in the lower-surface-side lifetime reduction region 93a has a shape that trails a skirt from a depth position of a peak concentration Np2 to the upper surface 21 of the semiconductor substrate 10. A width of the lower-surface-side lifetime reduction region 93a in the depth direction may be larger than that of the upper-surface-side lifetime reduction region 92 in the depth direction.

The lower-surface-side lifetime reduction region 93b is arranged nearer to the lower surface 23 side of the semiconductor substrate 10 in the depth direction than the lower-surface-side lifetime reduction region 93a. In a top view, the lower-surface-side lifetime reduction region 93b may be provided in the same range as that of the upper-surface-side lifetime reduction region 92, and may be provided in a different range therefrom. In a range narrower than that in the upper-surface-side lifetime reduction region 92, the lower-surface-side lifetime reduction region 93b of the present example is provided to cover the cathode region 82 in the top view.

The lower-surface-side lifetime reduction region 93b may be formed by irradiation of helium and the like from the lower surface 23 side of the semiconductor substrate 10. In this case, a concentration distribution of the recombination center in the lower-surface-side lifetime reduction region 93b has a shape that trails a skirt from a depth position of a peak concentration Np3 to the lower surface 23 of the semiconductor substrate 10. A width of the lower-surface-side lifetime reduction region 93b in the depth direction may be smaller than that of the lower-surface-side lifetime reduction region 93a in the depth direction.

The lower-surface-side lifetime reduction region 93b may be formed inside the buffer region 20 in the depth direction (Z-axis direction) of the semiconductor substrate 10. A peak position of the peak concentration Np3 in the lower-surface-side lifetime reduction region 93b may be formed so as not to be overlapped with a plurality of concentration peaks in the buffer region 20.

Only either of the lower-surface-side lifetime reduction region 93a and the lower-surface-side lifetime reduction region 93b may be provided, and both of them may be provided. A plurality of the lower-surface-side lifetime reduction region 93a may be provided in the depth direction of the semiconductor substrate 10. A plurality of the lower-surface-side lifetime reduction region 93b may be provided in the depth direction of the semiconductor substrate 10. In the present example, the lower-surface-side lifetime reduction region 93a is provided by one, and the lower-surface-side lifetime reduction region 93b is provided by one.

When the lower-surface-side lifetime reduction region 93a is provided, according to the thickness of the semiconductor substrate 10, the carrier lifetime can be reduced in a wide range from the upper surface 21 in the depth direction, thereby reducing a reverse recovery current or a reverse recovery charge. Also, when the lower-surface-side lifetime reduction region 93b is provided, a tail current at a final stage in reverse recovery can be reduced, thereby suppressing reverse recovery loss.

Figure 16:
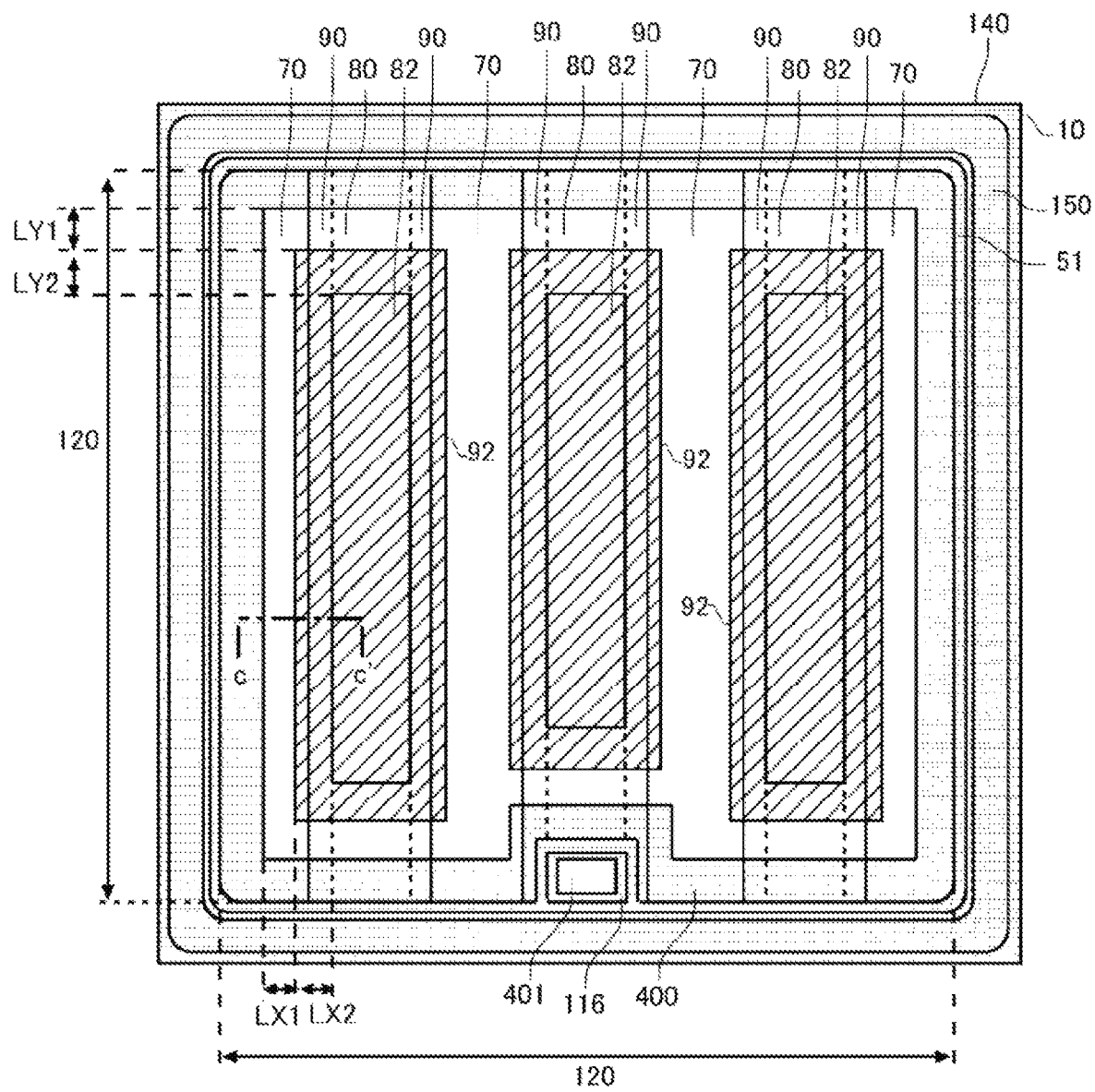
FIG. 16 is a drawing showing a structure on an upper surface of a semiconductor device 300 according to an embodiment of the present invention.

FIG. 16 is a drawing showing a structure on an upper surface of a semiconductor device 300 according to an embodiment of the present invention. A semiconductor device 300 further comprises a protective film 400 for the semiconductor device 100 described in FIG. 1 to FIG. 15. The protective film 400 is formed of an insulating material such as polyimide. The protective film 400 may be formed of a material different from those of the gate insulating film 42 and the interlayer dielectric film 26. At least a part of the protective film 400 is provided over the emitter electrode 52. The protective film 400 may be in contact with the semiconductor substrate 10, and may not be in contact with the semiconductor substrate 10. In the present example, the protective film 400 is in contact with the semiconductor substrate 10.

The protective film 400 is arranged to cover at least a part of the gate runner portion 51 in a surface parallel to the upper surface of the semiconductor substrate 10. The protective film 400 may be arranged to cover the whole gate runner portion 51. The protective film 400 of the present example is continuously formed from the outer peripheral edge 140 of the semiconductor substrate 10 to a position overlapped with a part of the active portion 120. The protective film 400 may be arranged to cover the whole edge termination structure portion 150, the whole gate runner portion 51 and the part of the active portion 120.

Also, the protective film 400 is arranged to cover at least a part of the gate pad 116. The protective film 400 is arranged to cover even the gate runner portion 51 that is provided so as to surround a part of the gate pad 116. The protective film 400 that covers the gate pad 116 is provided with an opening 401 that exposes a part of the gate pad 116.

The cathode region 82 is provided in a position that is not overlapped with the protective film 400 in a surface parallel to the upper surface of the semiconductor substrate 10. The protective film 400 of the present example is provided to surround a part of the active portion 120, and the cathode region 82 is arranged in a region of the active portion 120 surrounded by the protective film 400.

With such a configuration, it is facilitated that the upper-surface-side lifetime reduction region 92 that covers the whole cathode region 82 is arranged without being overlapped with the protective film 400. In a surface parallel to the upper surface of the semiconductor substrate 10, the upper-surface-side lifetime reduction region 92 of the present example is arranged to be overlapped with the whole cathode region 82 and so as not to be overlapped with the protective film 400.

Elements such as transistors are provided in the active portion 120 covered with the protective film 400. When the upper-surface-side lifetime reduction region 92 is formed by irradiation of helium ions or the like from the upper surface side of the protective film 400, depth positions implanted by helium ions or the like will be varied between a region covered with the protective film 400 and a region not covered therewith. For example, with respect to the region covered with the protective film 400, helium ions or the like will be implanted more shallowly as compared to a region not provided with the protective film 400, which will have an effect on element characteristics in diodes, transistors and so on.

On the other hand, according to the semiconductor device 300, the upper-surface-side lifetime reduction region 92 can be implanted in a uniform depth. For this reason, the characteristics of the semiconductor device 100 can be controlled with high precision. Also, since helium ions or the like that form the upper-surface-side lifetime reduction region 92 can be irradiated from the upper surface side of the semiconductor substrate 10, a local upper-surface-side lifetime reduction region 92 can be formed with a mask of a photoresist or the like, without a hard mask of metal or the like. For this reason, variations in position of the upper-surface-side lifetime reduction region 92 can be reduced. Since variations in position of the upper-surface-side lifetime reduction region 92 can be reduced, a positional margin at design time can be made smaller. Also, since the upper-surface-side lifetime reduction region 92 is arranged to cover the whole cathode region 82, a peak current in the diode section 80 during reverse recovery can be suppressed.

A distance LX2 between the protective film 400 and the cathode region 82 in the X-axis direction, and a distance LY2 between the protective film 400 and the cathode region 82 in the Y-axis direction each may be equal to or longer than 50 μm, and equal to or shorter than 400 μm. In this way, an area of the cathode region 82 can be maintained to some extent while a distance between the upper-surface-side lifetime reduction region 92 and the protective film 400 is secured. At least one of the distance LX2 and the distance LY2 may be equal to or longer than 100 μm and equal to or shorter than 300 μm. At least one of the distance LX2 and the distance LY may be equal to or longer than a thickness is of the semiconductor substrate 10 in the Z-axis direction, and may be equal to or shorter than 2 ts. The distance LX2 and the distance LY2 may be the same distance and may be a different distance with each other.

A distance LX1 between the protective film 400 and the upper-surface-side lifetime reduction region 92 in the X-axis direction, and a distance LY1 between the protective film 400 and the upper-surface-side lifetime reduction region 92 in the Y-axis direction each may be equal to or longer than 10 μm, and equal to or shorter than 50 μm. In this way, a distance from an edge of the protective film 400 to a resist end portion can be ensured, and an end portion position of the resist can be controlled with high precision even when the resist is formed in the vicinity of the edge of the protective film 400. At least one of the distance LX1 and the distance LY1 may be equal to or longer than 20 μm or more and equal to or shorter than 40 μm or less. The distance LX1 and the distance LY1 may be the same distance and may be a different distance with each other. The distance LX1 may be smaller than the distance LX2, and the distance LY1 may be smaller than the distance LY2.

An end portion of the gate trench portion 40 in the transistor section 70 in the Y-axis direction is provided at a position different from that of the protective film 400. The gate trench portion 40 of the present example is connected to the gate runner portion 51 at a position overlapped with the protective film 400.

An end portion of the dummy trench portion 30 in the diode section 80 in the Y-axis direction may be provided at a position overlapped with the protective film 400, and may be provided at a position not overlapped therewith. An end portion of the dummy trench portion 30 in the Y-axis direction may be provided at a position overlapped with the upper-surface-side lifetime reduction region 92.

Also, a range that one upper-surface-side lifetime reduction region 92 is overlapped with one transistor section 70 in the X-axis direction may be equal to or greater than 50 μm and equal to or smaller than 200 μm. With respect to the whole transistor section 70, a ratio that a region covered with the upper-surface-side lifetime reduction region 92 occupies may be 50% or less, may be 20% or less, and may be 10% or less. An arrangement of the upper-surface-side lifetime reduction region 92 in the transistor section 70 may be any of the aspects described in FIG. 1 to FIG. 15.

Figure 17A:
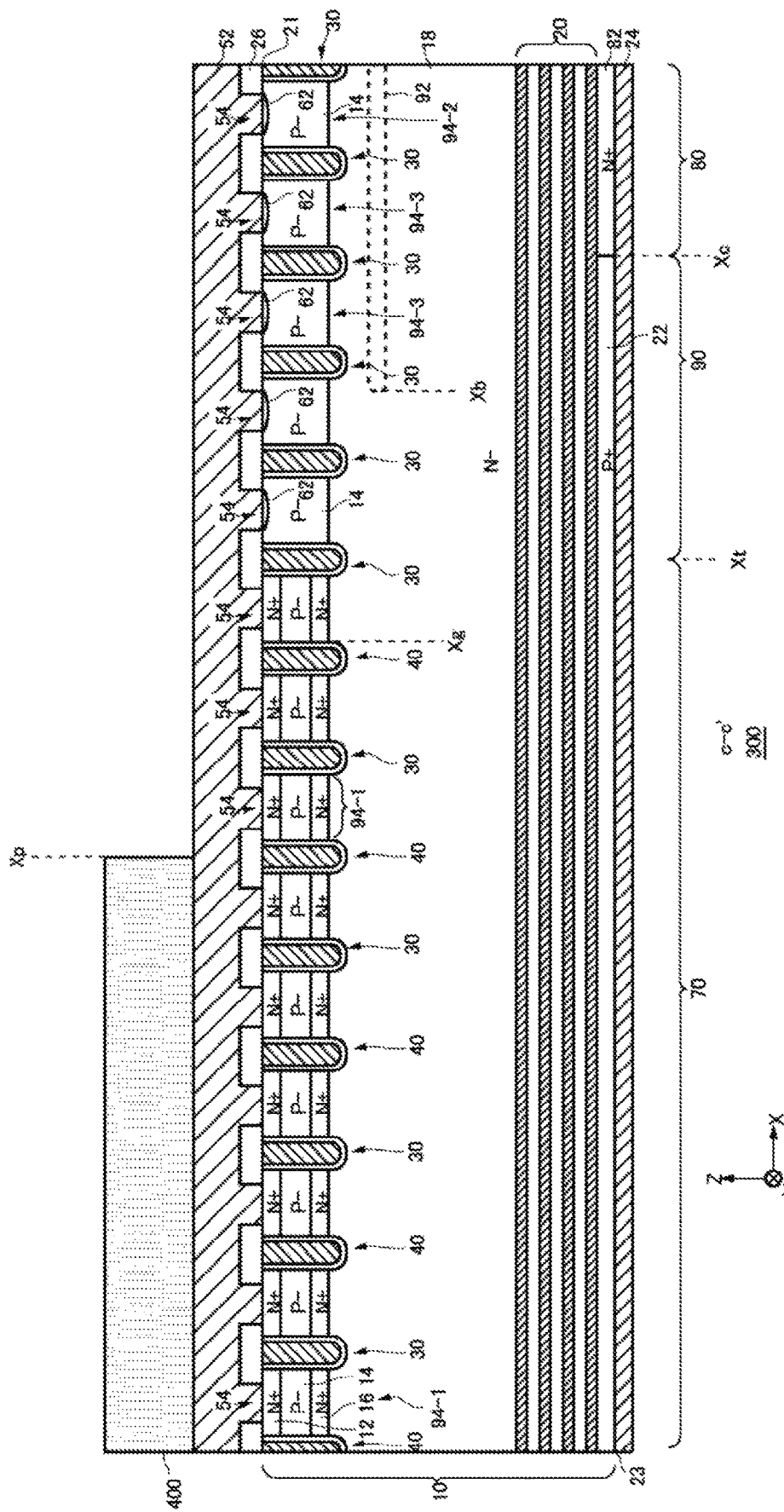
FIG. 17A is a drawing showing one example in a cross-section c-c' of FIG. 16.

FIG. 17A is a drawing showing one example in a cross-section c-c' of FIG. 16. As shown in FIG. 16, the protective film 400 covers a part of the transistor section 70 in the X-axis direction. The protective film 400 may not cover the boundary section 90 and the diode section 80 in the X-axis direction.

The upper-surface-side lifetime reduction region 92 is provided to cover the whole diode section 80 in the X-axis direction. The end portion position Xb of the upper-surface-side lifetime reduction region 92 in the X-axis direction may be arranged between the end portion position Xp of the protective film 400 in the X-axis direction and the end portion position Xc of the diode section 80 in the X-axis direction.

The end portion position Xb may be arranged between the boundary portion Xt of the boundary section 90 and the transistor section 70, and the end portion position Xc. That is, the upper-surface-side lifetime reduction region 92 may be terminated at a position overlapped with the boundary section 90 in the X-axis direction.

The end portion position Xb may be also arranged between the boundary position Xt and the end portion position Xp. That is, as shown in FIG. 16, the upper-surface-side lifetime reduction region 92 may be arranged to be overlapped with a part of the transistor section 70.

Figure 17B:
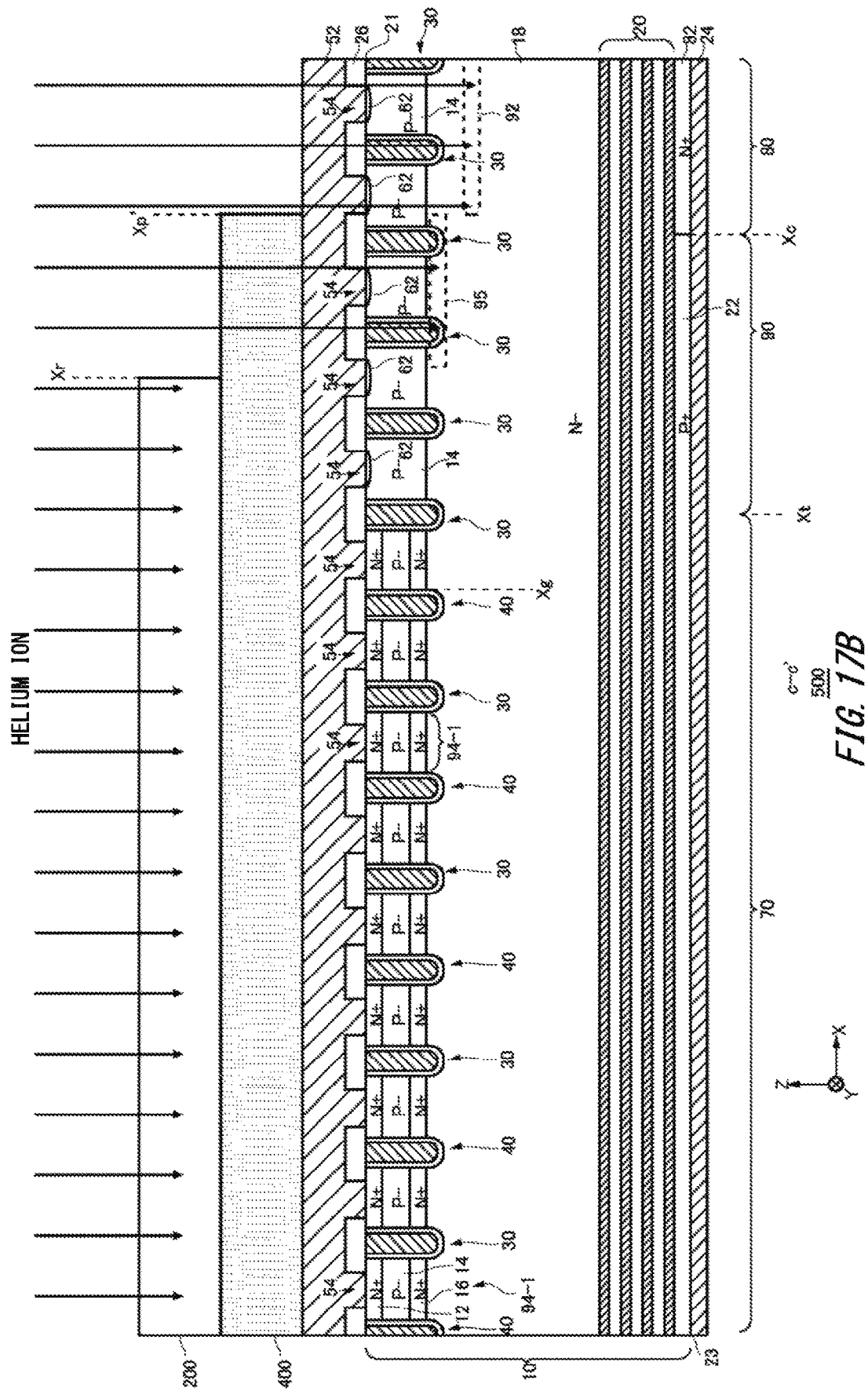
FIG. 17B shows a cross-section of a semiconductor device 500 at a halfway stage in a manufacturing process of a comparative example.

FIG. 17B shows a cross-section of the semiconductor device 500 at a halfway stage in a manufacturing process of a comparative example. The active portion 120 covered with the protective film 400 is provided with a transistor section 70, a boundary section 90, a diode section 80 and so on. The protective film 400 projects from the transistor section 70 to the boundary section 90 and the diode section 80, and an end Xp' of the protective film 400 is located inside the diode section 80.

When the upper-surface-side lifetime reduction region 92 is formed by irradiation of helium ions or the like from the upper surface side of the protective film 400, depth positions implanted by helium ions or the like will be varied between a region covered with the protective film 400 and a region not covered therewith. For example, when an end position Xp' of the protective film 400 is located inside the diode section 80 in a top view, and an end position Xr of the mask 200 is located in a more outer peripheral side of the semiconductor substrate 10 than the position Xp' (−X-axis direction), a region between the position Xr and the position Xp' protrudes the mask 200, so that the protective film 400 becomes an exposed region.

In this situation, when helium ions or the like are irradiated from the upper surface 21 side of the semiconductor substrate 10, the helium ions are shielded by the mask 200 because the upper surface 21 of the semiconductor substrate 10 is covered with the mask 200 in a −X-axis direction more than the position Xr, so that the helium ions do not reach the protective film 400 and the semiconductor substrate 10.

On the other hand, in the region between the position Xr and the position Xp', only the protective film 400 shields the helium ions or the like. Since a thickness of the protective film 400 is not a thickness capable of shielding completely helium ions, the helium ions penetrate the protective film 400 to reach the upper surface 21 of the semiconductor substrate 10. However, the helium ions are shielded to some extent by the protective film 400. For this reason, as compared to an area more inside the position Xp' (+X-axis direction), a shallow upper-surface-side lifetime reduction region 95 will be formed at a shallow depth on the upper surface 21 side. That is, in an introduction process of the same lifetime killer (helium ions in the present example), the helium ions or the like will be implanted more shallowly in the region provided with the protective film 400 as compared to the region not provided with the protective film 400, which will have an effect on element characteristics in diodes, transistors and so on.

Figure 17C:
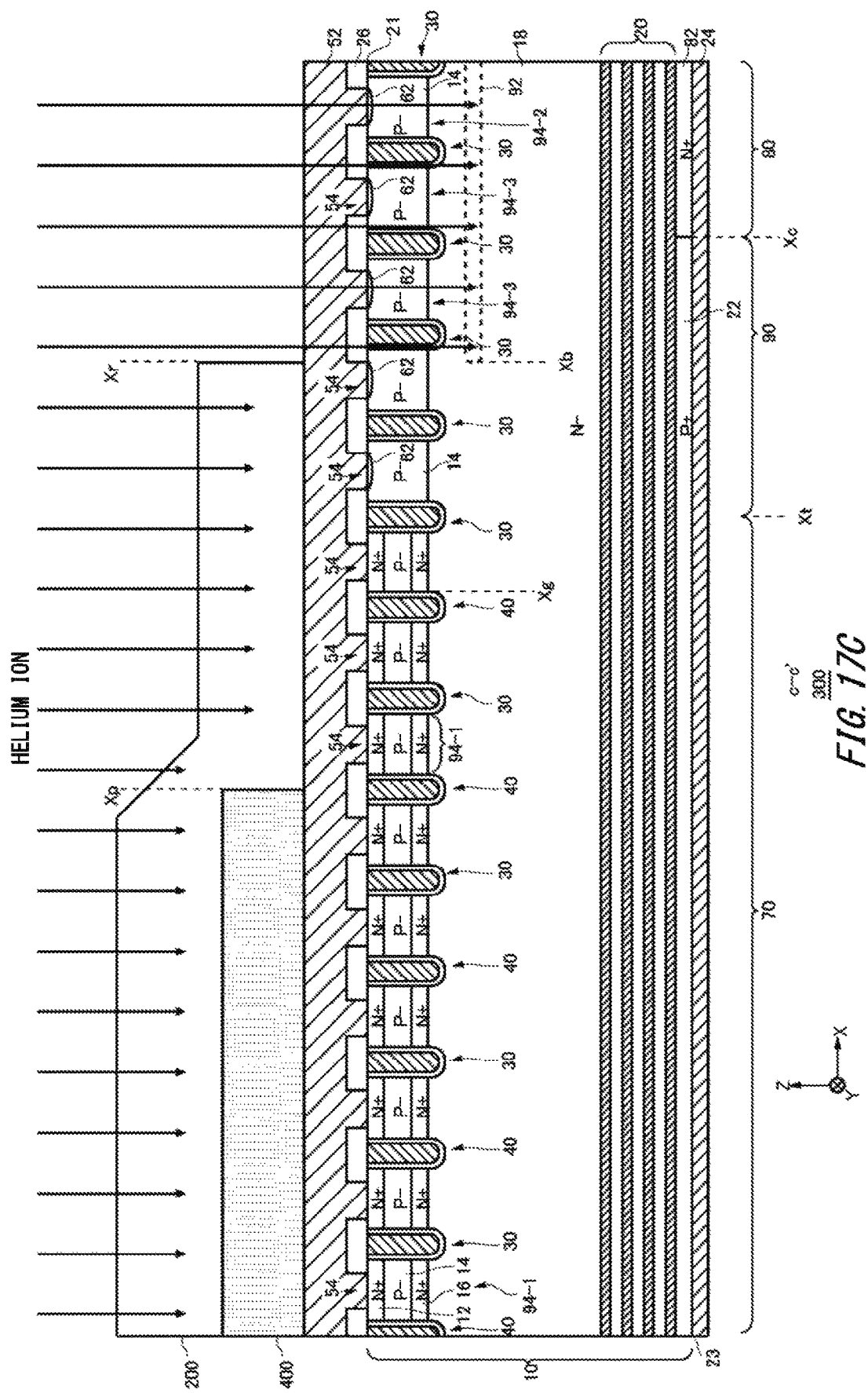
FIG. 17C shows a cross-section of a semiconductor device 300 at a halfway stage in a manufacturing process of the present example.

FIG. 17C shows a cross-section of the semiconductor device 300 at a halfway stage in a manufacturing process of the present example. In the manufacturing process of the present example, the mask 200 is formed such that the end Xr of the mask 200 is located more inside the semiconductor substrate 10 than the end position Xp of the protective film 400 (+X-axis direction). In particularly, the end position Xp of the protective film 400 is located inside the transistor section 70 or inside the boundary section 90 in a top view, and the end Xr of the mask 200 is located inside the diode section 80 in the top view. In this way, the upper-surface-side lifetime reduction region 92 can be implanted in a uniform depth. For this reason, characteristics of the semiconductor device 300 can be controlled with high precision.

Also, in the present example, the mask 200 is formed to be in contact with the protective film 400 with covering this in a top view, and to be also in contact with the emitter electrode 52. In this way, since helium ion or the like that form the upper-surface-side lifetime reduction region 92 can be irradiated from the upper surface side of the semiconductor substrate 10, a local upper-surface-side lifetime reduction region 92 can be formed with a mask of a photoresist or the like, without a hard mask of metal or the like. For this reason, variations in position of the upper-surface-side lifetime reduction region 92 can be reduced. Since variations in position of the upper-surface-side lifetime reduction region 92 can be reduced, a positional margin at design time can be made smaller. Also, since the upper-surface-side lifetime reduction region 92 is arranged to cover the whole cathode region 82, a peak current in the diode section 80 during reverse recovery can be suppressed.

Figure 18:
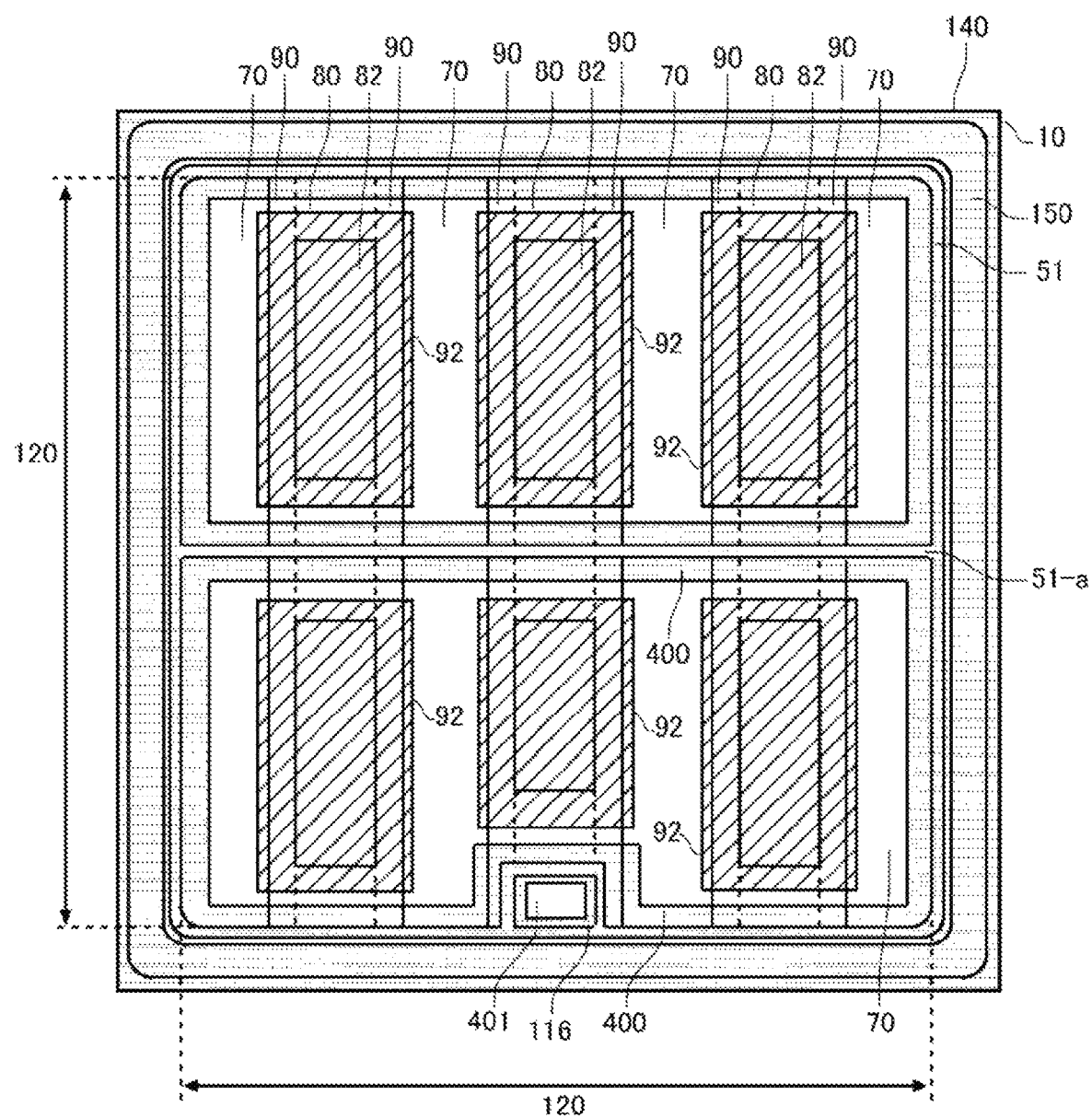
FIG. 18 is a drawing showing another structure on the upper surface of the semiconductor device 300.

FIG. 18 is a drawing showing another structure on the upper surface of the semiconductor device 300. Note that FIG. 18 is shown by omission of the gate pad 116. In the semiconductor device 300 of the present example, a portion (51-a) of the gate runner portion 51 is provided in the active portion 120. In the present example, a region of the active portion 120 that includes at least one of the transistor section 70 and the diode section 80 is referred to as an element region. The gate runner portion 51-a is arranged between the element regions (that is, at least any of between the transistor sections 70, between the diode sections 80, and between the transistor section 70 and the diode section 80). Note that in the present example, the boundary section 90 is also included in the element region.

The protective film 400 is also provided over the gate runner portion 51-a. The protective film 400 is also provided to cover the whole gate runner portion 51-a. Also, the well region 17 may be formed along the gate runner portion 51-a. In this case, the protective film 400 may be provided to cover the whole well region 17. When the protective film 400 is provided, an insulating film provided under the gate runner portion 51-a can be protected. Also, in a surface parallel to the upper surface of the semiconductor substrate 10, the upper-surface-side lifetime reduction region 92 is arranged so as not to be also overlapped with the protective film 400 over the gate runner portion 51-a. A distance in the Y-axis direction between the protective film 400 over the gate runner portion 51-a and the upper-surface-side lifetime reduction region 92 may be the same as the distance LY1 described in FIG. 16, and may be different from the distance LY1.

Figure 19:
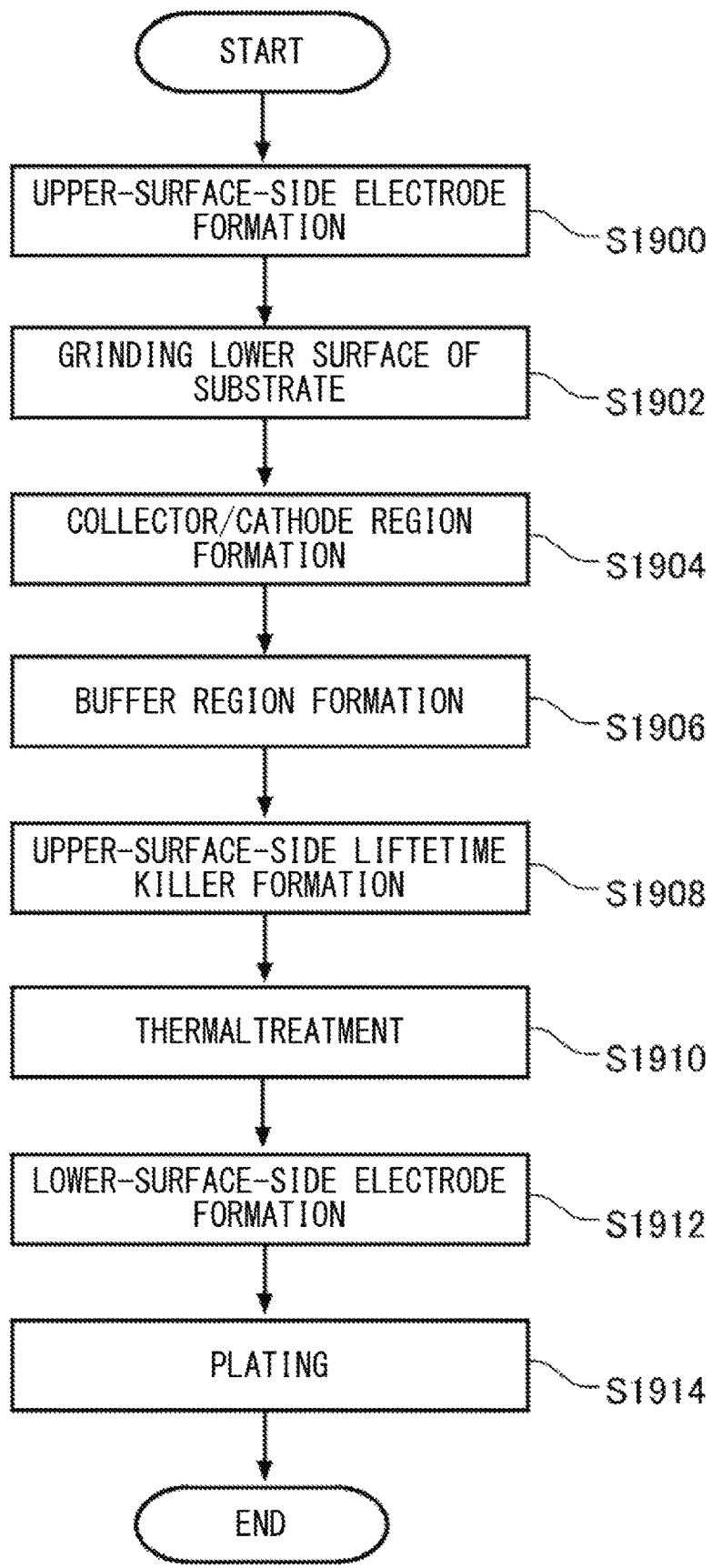
FIG. 19 is a drawing showing some processes in a manufacturing method that manufactures the semiconductor device 100 or the semiconductor device 300 described in FIG. 1 to FIG. 17.

FIG. 19 is a drawing showing some processes in a manufacturing method that manufactures the semiconductor device 100 or the semiconductor device 300 described in FIG. 1 to FIG. 17C. Prior to the processes shown in FIG. 19, each trench portion, each insulating film and each doping region are formed on the upper surface side of the semiconductor substrate 10 of N− type. The emitter region 12, the base region 14, the contact region 15, the well region 17, the accumulation region 16 and so on are included in the doping region. In the present example, the drift region 18 is a region that remains in the semiconductor substrate 10 without formation of each doping region. A process that forms a doping region may include an implantation process that implants impurities thereinto, and a thermal treatment process that activates the impurities.

Then, the metal electrodes such as the emitter electrode 52 and the gate metal layer 50 on the upper surface side are formed on the upper surface side of the semiconductor substrate 10 (S1900). After the formation of the upper-surface-side electrodes, the protective film 400 in a predetermined pattern is formed. Then, when the lower surface side of the semiconductor substrate 10 is subjected to grinding or the like, the thickness of the semiconductor substrate 10 is adjusted to a thickness according to a desired breakdown voltage (S1902).

Then, doping regions such as the collector region 22 and the cathode region 82 on the lower surface side of the semiconductor substrate 10 are formed (S1904). In S1906, the buffer region 20 may be formed.

Then, when helium ions or the like are irradiated from the upper surface side of the semiconductor substrate 10, the upper-surface-side lifetime reduction region 92 is formed (S1908). In S1908, a predetermined mask pattern by a resist may be formed on the upper surface side of the semiconductor substrate 10. In S1908, the mask pattern by the resist or the like is formed to cover the whole protective film 400. After irradiation of helium ions or the like, a thermal treatment is carried out in a predetermined condition (S1910).

Then, an lower-surface-side electrode such as the collector electrode 24 is formed on the lower surface side of the semiconductor substrate 10 (S1912). Then, a plating is carried out on at least the upper surface of the upper-surface-side electrode. In the plating process, the plating may be also carried out on the lower surface of the lower-surface-side electrode. When the plating is carried out, a connection resistance between a lead frame or bonding wire made of copper, or the like, and each electrode can be reduced.

Note that in the process that forms the upper-surface-side lifetime reduction region 92 (S1908), when helium ions or the like are irradiated from the upper surface side, unevenness is formed moderately on the upper surface of the upper-surface-side electrode such as aluminum. When the plating process (S1914) is carried out after that process, a contact area between the upper surface of the underlaid upper-surface-side electrode and a plating layer can be increased. In this way, adhesion between the upper-surface-side electrode and the plating layer is improved, and also the connection resistance is reduced. Also, since the plating process (S1914) is carried out after the thermal treatment (S1910), it can be prevented that the plating layer is oxidized by the thermal treatment S1910.

Figure 20:
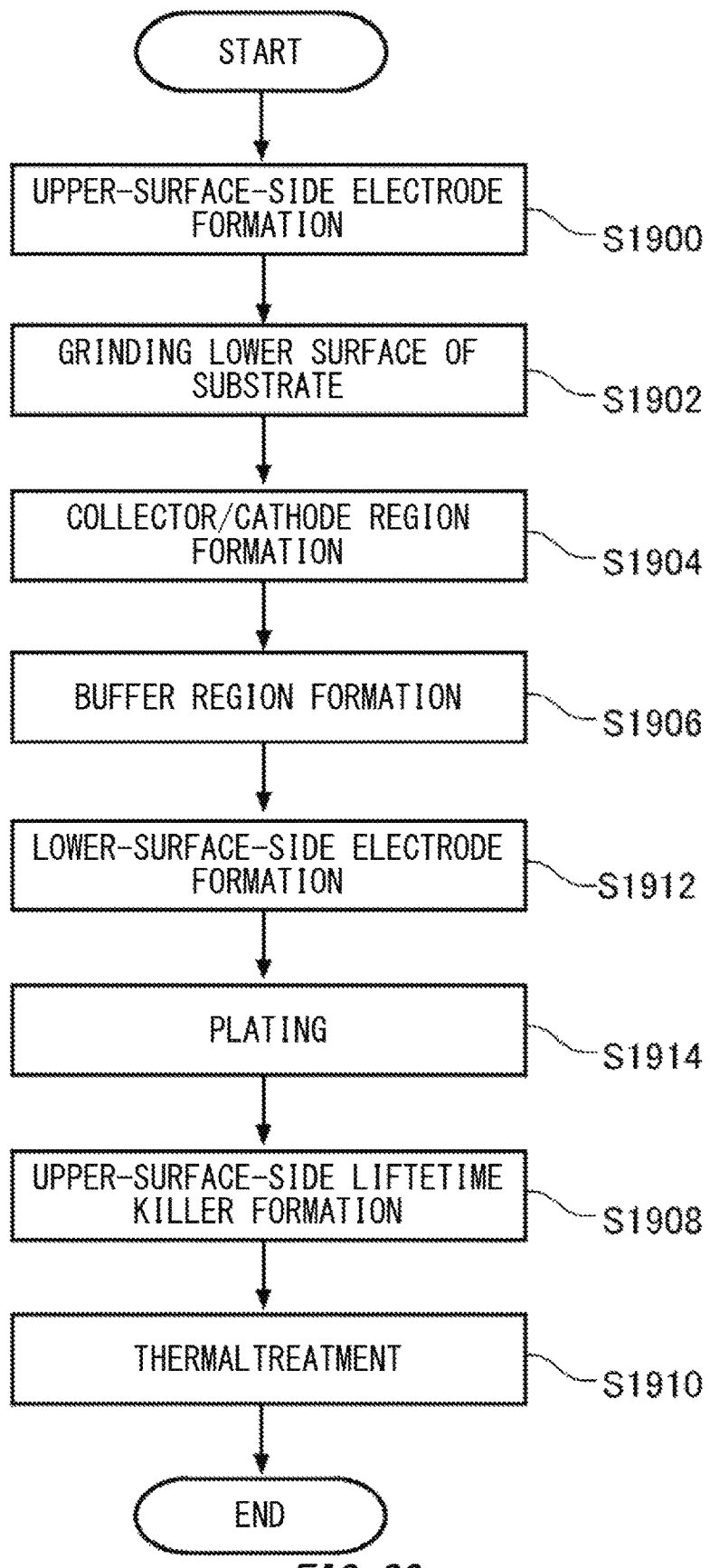
FIG. 20 is a drawing showing another example in the manufacturing method of the semiconductor device.

FIG. 20 is a drawing showing another example in the manufacturing method of the semiconductor device. The processes from S1900 to S1906 in the present example are the same as those in the examples of FIG. 19. In the present example, after the process of S1906, the lower-surface-side electrodes are formed (S1912).

Then, the plating process (S1914) is carried out, and then the upper-surface-side lifetime reduction region is formed (S1908). And, the thermal treatment process is carried out (S1910). Also with such processes, the semiconductor device can be manufactured.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The execution order of respective processes such as operations, procedures, steps and stages in methods shown in the claims, specification, and drawings, even when described using phrases such as "first" or "next" for convenience, it does not necessarily mean that the process must be performed in this order.

EXPLANATION OF REFERENCES

Numeral 10 . . . semiconductor substrate, 12 . . . emitter region, 14 . . . base region, 15 . . . contact region, 16 . . . accumulation region, 17 . . . well region, 18 . . . drift region, 20 . . . buffer region, 21 . . . upper surface, 22 . . . collector region, 23 . . . lower surface, 24 . . . collector electrode, 26 . . . interlayer dielectric film, 30 . . . dummy trench portion, 32 . . . dummy insulating film, 34 . . . dummy conductive portion, 40 . . . gate trench portion, 42 . . . gate insulating film, 44 . . . gate conductive portion, 50 . . . gate metal layer, 51 . . . gate runner portion, 52 . . . emitter electrode, 54 . . . contact hole, 55 . . . contact hole, 56 . . . contact hole, 57 . . . connecting portion, 59 . . . insulating film, 60 . . . end portion, 62 . . . contact region, 70 . . . transistor section, 80 . . . diode section, 82 . . . cathode region, 90 . . . boundary section, 92 . . . upper-surface-side lifetime reduction region, 93 . . . lower-surface-side lifetime reduction region, 94 . . . mesa portion, 95 . . . upper-surface-side lifetime reduction region, 100 . . . semiconductor device, 116 . . . gate pad, 120 . . . active portion, 130 . . . region, 140 . . . outer peripheral edge, 150 . . . edge termination structure portion, 200 . . . mask, 300 . . . semiconductor device, 400 . . . protective film, 401 . . . opening, 500 . . . semiconductor device

What is claimed is:

1. A manufacturing method of manufacturing a semiconductor device,
the semiconductor device comprising:
a semiconductor substrate;
a transistor section provided in the semiconductor substrate to have an emitter region of a first conductivity type on an upper surface side of the semiconductor substrate, and to have a collector region of a second conductivity type in a lower surface side of the semiconductor substrate;
a diode section provided in the semiconductor substrate to have a cathode region of the first conductivity type on the lower surface side of the semiconductor substrate; and
a boundary section provided between the transistor section and the diode section in the semiconductor substrate to have the collector region in a back surface side of the semiconductor substrate, not having the emitter region on the upper surface side of the semiconductor substrate,
wherein the transistor section has one or more gate trench portions which are provided from an upper surface of the semiconductor substrate to a position deeper than the emitter region, and to each of which a gate potential is applied, and
an upper-surface-side lifetime reduction region is provided on the upper surface side of the semiconductor substrate in the diode section and a partial region of the boundary section using a mask material such that no lifetime reduction region is provided in any region between the upper surface of the semiconductor substrate and a lower surface of the semiconductor substrate that is overlapped with the one or more gate trench portions in the transistor section in a surface parallel to the upper surface of the semiconductor substrate, and
the manufacturing method comprises:
forming the upper-surface-side lifetime reduction region by introducing a lifetime killer from the upper surface side of the semiconductor substrate thereinto.

2. The manufacturing method according to claim 1, comprising:
the introducing the lifetime killer from the upper surface side of the semiconductor substrate thereinto is performed after formation of an emitter electrode over the upper surface of the semiconductor substrate; and
forming a plating layer on an upper surface of the emitter electrode after introducing the lifetime killer.

3. The manufacturing method according to claim 1, wherein
the forming the upper-surface-side lifetime reduction region includes:
after formation of an emitter electrode over the upper surface of the semiconductor substrate, forming a protective film over the emitter electrode; and
introducing the lifetime killer from an upper surface side of the protective film.

4. The manufacturing method according to claim 3, wherein
in the forming the protective film, the protective film is formed such that the protective film is not overlapped with the cathode region in a surface parallel to the upper surface of the semiconductor substrate.

5. The manufacturing method according to claim 3, further comprising:

forming a mask pattern by a resist to cover the protective film after forming the protective film.

6. The manufacturing method according to claim 3, wherein the protective film is a continuous layer having a predetermined pattern.

7. The manufacturing method according to claim 2, further comprising performing a thermal treatment process, after introducing the lifetime killer and before forming the plating layer.

8. The manufacturing method according to claim 1, further comprising:
- forming an emitter electrode over the upper surface of the semiconductor substrate and a collector electrode on the lower surface side of the semiconductor substrate; and
- forming a plating layer on at least an upper surface of the emitter electrode;

wherein
the forming the upper-surface-side lifetime reduction region is performed after forming the plating layer, and
a thermal treatment process is performed after forming the upper-surface-side lifetime reduction region.

* * * * *